(12) United States Patent
Arai

(10) Patent No.: US 7,599,667 B2
(45) Date of Patent: Oct. 6, 2009

(54) WIRELESS COMMUNICATION APPARATUS AND SEMICONDUCTOR DEVICE

(75) Inventor: Satoshi Arai, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 434 days.

(21) Appl. No.: 10/790,709

(22) Filed: Mar. 3, 2004

(65) Prior Publication Data

US 2005/0136850 A1    Jun. 23, 2005

(30) Foreign Application Priority Data

Dec. 17, 2003    (JP) .............................. 2003-419563

(51) Int. Cl.
    *H04B 1/44*    (2006.01)
(52) U.S. Cl. .............................. 455/78; 455/73; 455/88; 455/550.1
(58) Field of Classification Search ................ 455/78, 455/88, 300, 550.1, 73, 333
    See application file for complete search history.

(56) References Cited

U.S. PATENT DOCUMENTS

| | | | | |
|---|---|---|---|---|
| 4,792,939 | A * | 12/1988 | Hikita et al. | ................. 370/277 |
| 5,150,282 | A * | 9/1992 | Tomura et al. | ............... 361/818 |
| 5,335,147 | A * | 8/1994 | Weber | ......................... 361/818 |
| 6,507,728 | B1 | 1/2003 | Watanabe et al. | |

| | | | |
|---|---|---|---|
| 2002/0027009 | A1 * | 3/2002 | Sato et al. .................. 174/35 R |

FOREIGN PATENT DOCUMENTS

| | | |
|---|---|---|
| EP | 1 120 921 A2 | 8/2001 |
| JP | 4-58596 | 2/1992 |
| JP | 7-66746 | 3/1995 |
| JP | 10-290174 | 10/1998 |
| JP | 2000-299438 | 10/2000 |
| JP | 2001-86022 | 3/2001 |
| JP | 2001-345419 | 12/2001 |
| JP | 2002-50733 | 2/2002 |
| JP | 2002-111532 | 4/2002 |
| JP | 2003-101320 | 4/2003 |
| WO | WO 00/48266 | 8/2000 |

* cited by examiner

*Primary Examiner*—Nay A Maung
*Assistant Examiner*—Tuan H Nguyen
(74) *Attorney, Agent, or Firm*—Oblon, Spivak, McClelland, Maier & Neustadt, P.C.

(57) ABSTRACT

A wireless communication apparatus includes a mounting substrate having a duplexer, receiving and transmitting amplifiers individually connected to the duplexer, a processor unit having receiving and transmitting processors connected to the respective amplifiers, and a baseband processor connected to the processor unit. A shield case covers the amplifiers and the processor unit, and has a first partition provided from a top panel to a mounting substrate surface for separating the receiving and transmitting amplifiers, extending from an end and a second partition extends to another end from a cut extending from the first partition being laid across the processor unit.

7 Claims, 20 Drawing Sheets

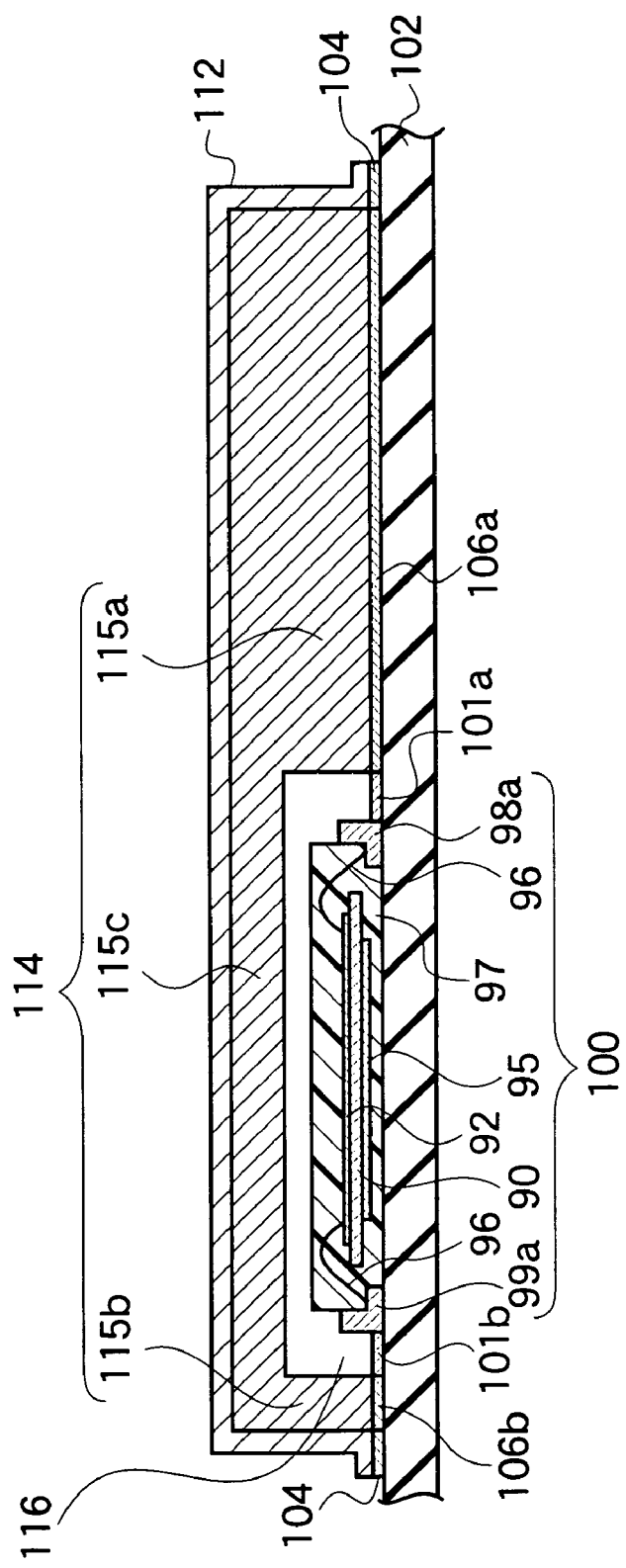
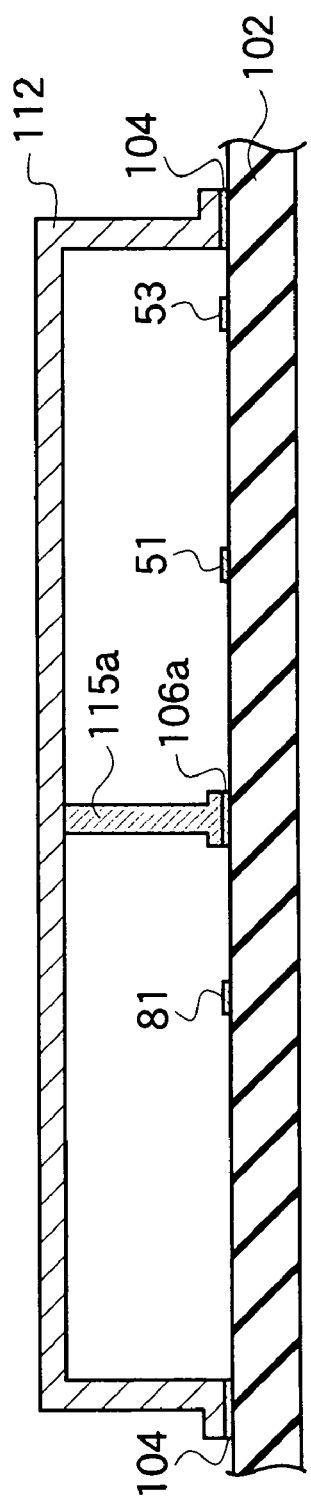

WIRELESS COMMUNICATION APPARATUS AND SEMICONDUCTOR DEVICE

CROSS REFERENCE TO RELATED APPLICATIONS

This application is based upon and claims the benefit of priority from prior Japanese Patent Application P2003-419563 filed on Dec. 17, 2003; the entire contents of which are incorporated by reference herein.

BACKGROUND OF THE INVENTION

1. Field of the Invention

The present invention relates to a wireless communication apparatus. In particular, the present invention relates to a semiconductor device in which transmitter and receiver circuits are integrated on a semiconductor chip, and to a wireless communication apparatus using the same.

2. Description of the Related Art

In a wireless communication apparatus used for a cellular phone and the like, a transmitting unit and a receiving unit are installed in a chassis or phone housing. In the receiving unit of the wireless communication apparatus, electrical characteristics deteriorate due to electromagnetic disturbances caused by spurious signals entering from the transmitting unit of the wireless communication apparatus, interference waves from other wireless communication apparatuses, and the like. The closest source of electromagnetic disturbance for the receiving unit is the transmitting unit in the same chasis. For example, in a wireless communication apparatus using a time division duplex (TDD) mode such as the personal handyphone system (PHS) which is served in Japan, China, and some Asian countries, timing between transmission and reception differs from each other. Therefore, even when installing a transmitting unit and a receiving unit in the same shield, spurious signals are not generated because operation of the transmitting unit can be suspended during reception. However, in communication methods defined by Interim Standard-95 (IS-95), which is one of the standards for a cellular phone system using code division multiple access (CDMA), and as defined by the 3rd Generation Partnership Project (3GPP), transmitting and receiving units simultaneously operate. Thus, in a wireless communication apparatus used for a communication system in which transmitting and receiving units simultaneously operate, part of transmitting radio frequency (RF) output signals, or spurious signals and the like may create an electromagnetic disturbance to the receiving unit, and cause problems including the deterioration of reception sensitivity. Therefore, in a wireless communication apparatus, in order to prevent the deterioration of electrical characteristics of a receiving unit, each of transmitting and receiving units needs a grounded shield. In a current wireless communication apparatus, parts for the transmitting and receiving units can be positioned so as to be separated from each other. Accordingly, each of transmitting and receiving units can be independently shielded. Moreover, since sufficient electrical isolation between the transmitting and receiving units can be provided by grounded shields, a transmitter signal entering from the transmitting unit to the receiving unit can be suppressed.

However, advances in integrated circuits (ICs) for transmitting and receiving units based on the demand for miniaturization of a wireless communication apparatus has developed a semiconductor device which is monolithically integrated on a single chip which has a part of transmitter and receiver circuits encapsulated in a package. In a wireless communication apparatus using such a semiconductor device, shielding against interference waves from external wireless communication apparatuses is possible. However, it is difficult to provide shielding so as to completely isolate the transmitting and receiving units. Therefore, the electromagnetic disturbance by undesired signals which are transmitting spurious and its transmitting signal entering from the transmitting unit to the receiving unit deteriorates the receiving characteristics of the wireless communication apparatus. Moreover, in a semiconductor chip of the transceiver monolithic IC, signals leaked in the receiving side from the transmitting side also deteriorate characteristics of the receiving circuit.

SUMMARY OF THE INVENTION

A first aspect of the present invention inheres in a wireless communication apparatus, including: a mounting substrate including: a duplexer connected to an antenna terminal; a receiving amplifier and a transmitting amplifier individually connected to the duplexer; a processor unit having a receiving processor and a transmitting processor respectively connected to the receiving and transmitting amplifiers in a region spaced from the receiving and transmitting amplifiers; and a baseband processor connected to the processor unit; a shield case configured to cover the receiving amplifier, the transmitting amplifier, and the processor unit; a first partition provided from a top panel of the shield case to a surface of the mounting substrate so as to separate the receiving and transmitting amplifiers by extending from an end of the shield case; and a second partition extending to the another end of the shield case from a cut, the cut extending from the first partition in the shield case so as to be laid across the processor unit.

A second aspect of the present invention inheres in a semiconductor device, including: a semiconductor chip configured to monolithically integrate a receiving processor which converts a radio frequency receiving signal into a baseband receiving signal, a transmitting processor which converts a baseband transmitting signal into a radio frequency transmitting signal, and a ground region located to separate the receiving and transmitting processors; a first ground terminal connected to the ground region and located between a receiving input terminal for the radio frequency receiving signal and a transmitting output terminal for the radio frequency transmitting signal, the receiving input terminal and the transmitting output terminal being provided in a first end of the semiconductor chip; a second ground terminal connected to the ground region and located between a receiving output terminal for the baseband receiving signal and a transmitting input terminal for the baseband transmitting signal, the receiving output terminal and the transmitting input terminal being provided in a second end of the semiconductor chip facing the first end; and a package configured to seal the semiconductor chip.

BRIEF DESCRIPTION OF DRAWINGS

FIG. 6 is a diagram showing a cross section of the shield of the wireless communication apparatus taken along line VI-VI in FIG. 5.

FIG. 7 is a diagram showing a cross section of the shield of the wireless communication apparatus taken along line VII-VII in FIG. 5.

DETAILED DESCRIPTION OF THE INVENTION

Figure 1:
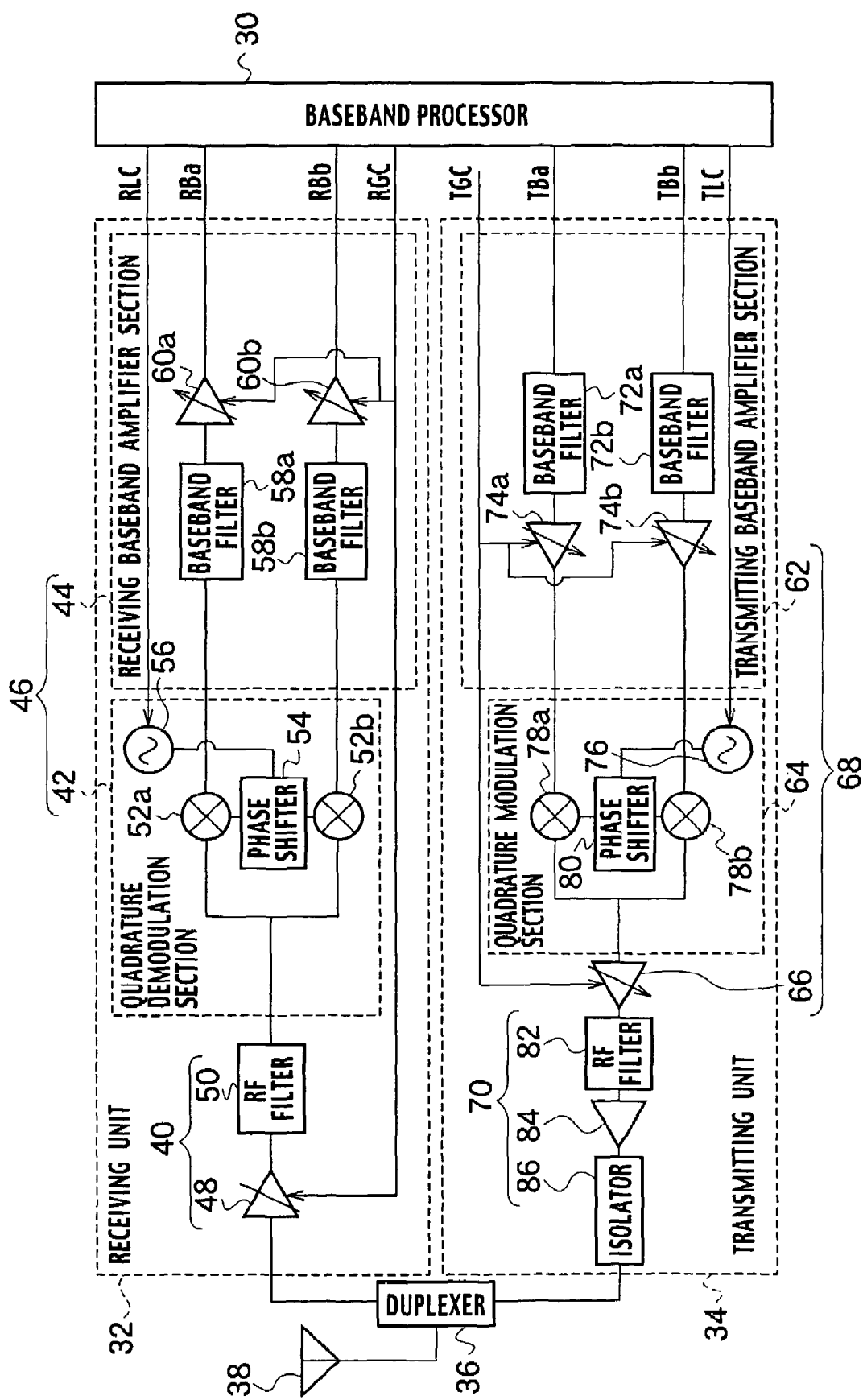
FIG. 1 is a block diagram showing an example of a wireless communication apparatus according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

As shown in FIG. 1, a wireless communication apparatus according to an embodiment of the present invention includes an antenna 38, a duplexer 36 connected to the antenna 38, a receiving unit 32 and a transmitting unit 34 individually connected to the duplexer 36, a baseband processor 30 connected to the receiving unit 32 and the transmitting unit 34. The duplexer 36 is provided so that the antenna 38 may serve for both transmission and reception. The duplexer 36 separates an RF receiving signal and an RF transmitting signal using a frequency difference between the RF receiving and RF transmitting signals. Thus, deterioration of characteristics caused by the RF transmitting signal output from the transmitting unit 34 which enters the receiving unit 32, and by the RF receiving signal received by the antenna 38 which enters the transmitting unit 34, may be avoided. The receiving unit 32 converts the RF receiving signal sent from the duplexer 36 into a baseband receiving signal. The transmitting unit 34 converts a baseband transmitting signal into the RF transmitting signal to send the RF transmitting signal to the duplexer 36. The baseband processor 30 demodulates the baseband receiving signal input from the receiving unit 32 to a receiving signal, and modulates a transmitting signal to the baseband transmitting signal to output the baseband transmitting signal to the transmitting unit 34.

In the receiving unit 32, a receiving amplifier 40 for amplifying the RF receiving signal, and a receiving processor 46 for converting the amplified RF receiving signal into the baseband receiving signal and amplifying the baseband receiving signal are provided. A low noise amplifier (LNA) 48 connected to the duplexer 36, and an RF filter 50 connected to the LNA 48 are provided in the receiving amplifier 40. The RF receiving signal received by the antenna 38 is amplified by the LNA 48 through the duplexer 36, and out-of-band signal components of the RF receiving signal are attenuated by the RF filter 50. The receiving processor 46 includes a quadrature demodulation section 42 and a receiving baseband amplifier section 44. Mixers 52a and 52b individually connected to the RF filter 50, and a local oscillator (LO) 56 connected to the mixers 52a and 52b through a phase shifter 54, are provided in the quadrature demodulation section 42. Signals which are obtained by separating the RF receiving signal from the RF filter 50 and input into the mixers 52a and 52b, are mixed with LO signals obtained by separating an oscillation signal of the LO 56, which are 90 degrees out of phase with each other, using the phase shifter 54, and converted (down-converted) into two quadrature baseband receiving signals. Baseband filters 58a and 58b respectively connected to the mixers 52a and 52b, and variable gain amplifiers 60a and 60b respectively connected to the baseband filters 58a and 58b are provided in the receiving baseband amplifier section 44. Out-of-band signal components of the quadrature baseband receiving signals output from the mixers 52a and 52b are respectively attenuated by the baseband filters 58a and 58b, and the quadrature baseband receiving signals are respectively amplified to a predetermined level by the variable gain amplifiers 60a and 60b. Thus, the quadrature baseband receiving signals RBa and RBb are output from the receiving baseband amplifier section 44 of the receiving processor 46 to the baseband processor 30.

Here, an oscillation frequency of the oscillation signal of the LO 56 of the quadrature demodulation section 42 is controlled so as to be almost the same frequency as the RF receiving signal by a receiving LO control signal RLC provided from the baseband processor 30. Alternatively, the oscillation frequency of the oscillation signal of the LO 56 may be controlled so as to be n times that of the RF receiving signal (n is an integer equal to or larger than 2) and divided by n using a frequency divider circuit provided in the phase shifter 54 to be input to the mixers 52a and 52b. Moreover, the gains of the LNA 48 and the variable gain amplifiers 60a and 60b are controlled by a receiving gain control signal RGC provided from the baseband processor 30.

A transmitting processor 68 for amplifying the baseband transmitting signal and converting the baseband transmitting signal into the RF transmitting signal, and a transmitting amplifier 70 for amplifying power of the RF transmitting signal are provided in the transmitting unit 34. The transmitting processor 68 includes a transmitting baseband amplifier section 62, a quadrature modulation section 64, and an RF amplifier 66. Baseband filters 72a and 72b individually connected to the baseband processor 30, and variable gain amplifiers 74a and 74b connected to the baseband filters 72a and 72b are provided in the transmitting baseband amplifier section 62. Out-of-band signal components of baseband transmitting signals TBa and TBb modulated by the baseband processor 30 are respectively attenuated by the baseband filters 72a and 72b, and the baseband transmitting signals TBa and TBb are respectively amplified to a predetermined level by the variable gain amplifiers 74a and 74b. Mixers 78a and 78b respectively connected to the variable gain amplifiers 74a and 74b, and an LO 76 connected to the mixers 78a and 78b through a phase shifter 80 are provided in the quadrature modulation section 64. The baseband transmitting signals respectively input from the variable gain amplifiers 74a and 74b to the mixers 78a and 78b are mixed with LO signals obtained by separating an oscillation signal of the LO 76, which are 90 degrees out of phase with each other, using the phase shifter 80, and converted (up-converted) into two quadrature RF transmitting signals. The outputs of the mixers 78a and 78b are coupled together and connected to the RF amplifier 66. The RF transmitting signals, up-converted by the mixers 78a and 78b, are amplified to a predetermined level by the RF amplifier 66. An RF filter 82 connected to the RF amplifier 66, a transmitting high power amplifier (HPA) 84 connected to the RF filter 82, and an isolator 86 connected to the HPA 84 are provided in the transmitting amplifier 70. Out-of-band signal components of the RF transmitting signal output from the RF amplifier 66 are attenuated by the RF filter 82, and the power of the RF transmitting signal is amplified by the HPA 84, thus outputting the RF transmitting signal to the duplexer 36 through the isolator 86.

Here, the oscillation frequency of the oscillation signal from the LO 76 of the quadrature modulation section 64 is controlled so as to be almost the same frequency as the RF transmitting signal by a transmitting LO control signal TLC provided from the baseband processor 30. Alternatively, the oscillation frequency of the oscillation signal of the LO 76 may be controlled so as to be n times that of the RF transmitting signal (n is an integer equal to or larger than 2) and divided by n using a frequency divider circuit provided in the phase shifter 80 to be input into the mixers 78a and 78b. Moreover, the gains of the RF amplifier 66 and the variable gain amplifiers 74a and 74b are controlled by a transmitting gain control signal TGC provided from the baseband processor 30.

Figure 2:
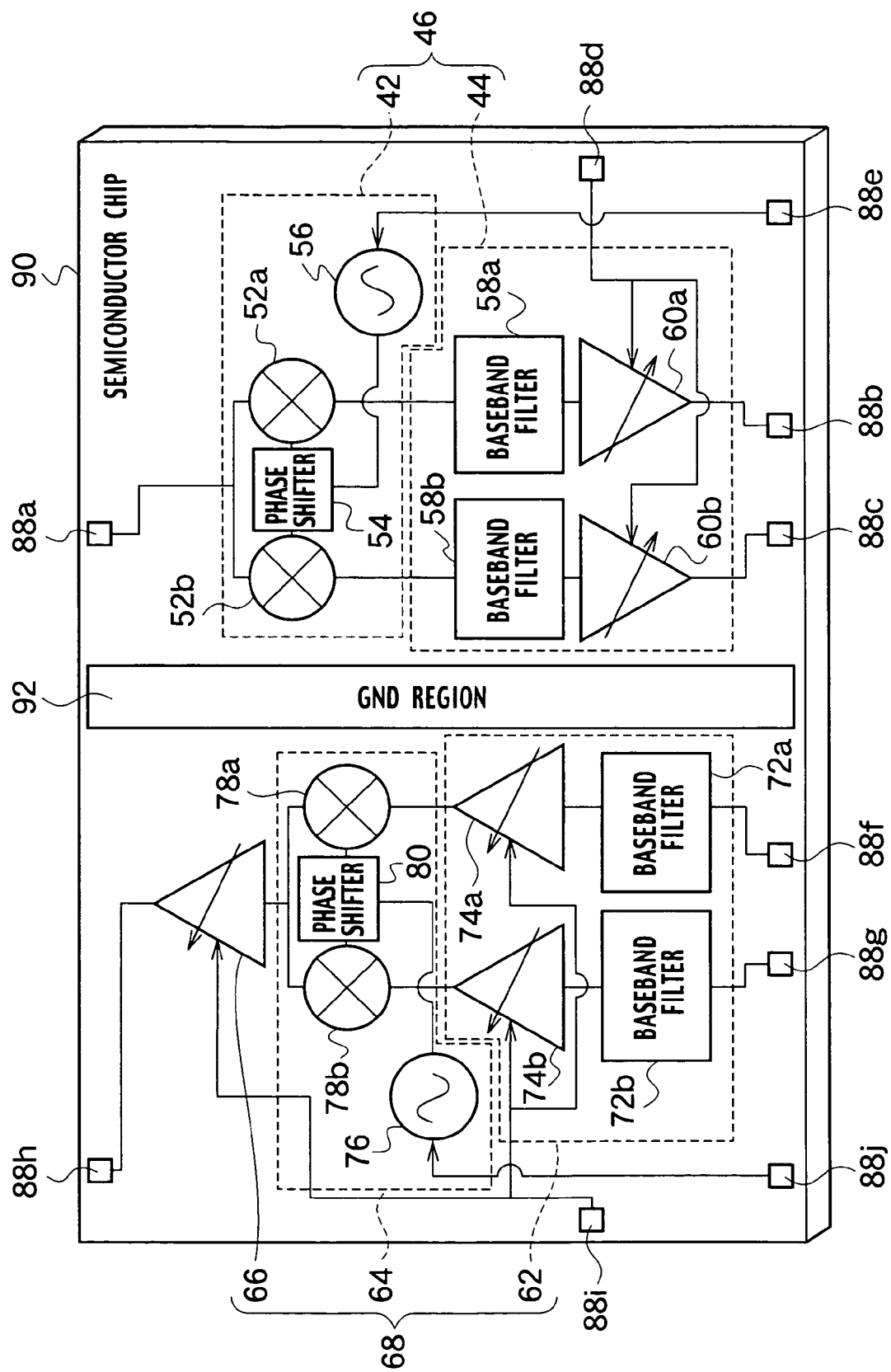
FIG. 2 is a diagram showing an example of a semiconductor chip of a semiconductor device according to the embodiment of the present invention.

As shown in FIG. 2, in the wireless communication apparatus according to the embodiment, the receiving processor 46 and the transmitting processor 68 are monolithically integrated on a single semiconductor chip 90. For example, the receiving processor 46 is placed in a region on the right half plane of the rectangular semiconductor chip 90 in the drawing, and the transmitting processor 68 is placed in a region on the left half plane thereof in the drawing. An RF receiving signal input section of the receiving processor 46 and an RF transmitting signal output section of the transmitting processor 68 are placed or located near an upper end of the semiconductor chip 90 in the drawing, and a baseband receiving signal output section and a baseband transmitting signal input section are placed or located near a lower end of the semiconductor chip 90 in the drawing. Moreover, a rectangular ground region 92 extending from a vicinity of the upper end of the semiconductor chip 90 to a vicinity of the lower end thereof along the vertical direction in the drawing is placed or located between the receiving processor 46 and the transmitting processor 68.

In the region of the receiving processor 46, a bonding pad 88a for RF receiving signal input which is connected to the mixers 52a and 52b of the quadrature demodulation section 42 is provided in the vicinity of the upper end of the semiconductor chip 90. In the vicinity of the lower end of the semiconductor chip 90, bonding pads 88b and 88c are provided for baseband receiving signal output which are respectively connected to the variable gain amplifiers 60a and 60b of the receiving baseband amplifier section 44. Moreover, a bonding pad 88d for a gain control signal for the variable gain amplifiers 60a and 60b is provided in a vicinity of the right periphery of the semiconductor chip 90, and a bonding pad 88e for an LO control signal for the LO 56 is provided in a vicinity of a lower right corner of the semiconductor chip 90.

In a region where the transmitting processor 68 is located, bonding pads 88f and 88g for baseband transmitting signal input which are respectively connected to the baseband filters 72a and 72b of the transmitting baseband amplifier section 62 are provided in the vicinity of the lower end of the semiconductor chip 90. In the vicinity of the upper end of the semiconductor chip 90, a bonding pad 88h is provided for RF transmitting signal output which is connected to the RF amplifier 66. Moreover, a bonding pad 88i for a gain control signal for the RF amplifier 66 and the variable gain amplifiers 74a and 74b is provided in a vicinity of a left periphery of the semiconductor chip 90, and a bonding pad 88j for the LO control signal for the LO 76 is provided in a vicinity of a lower left corner of the semiconductor chip 90.

Figure 3:
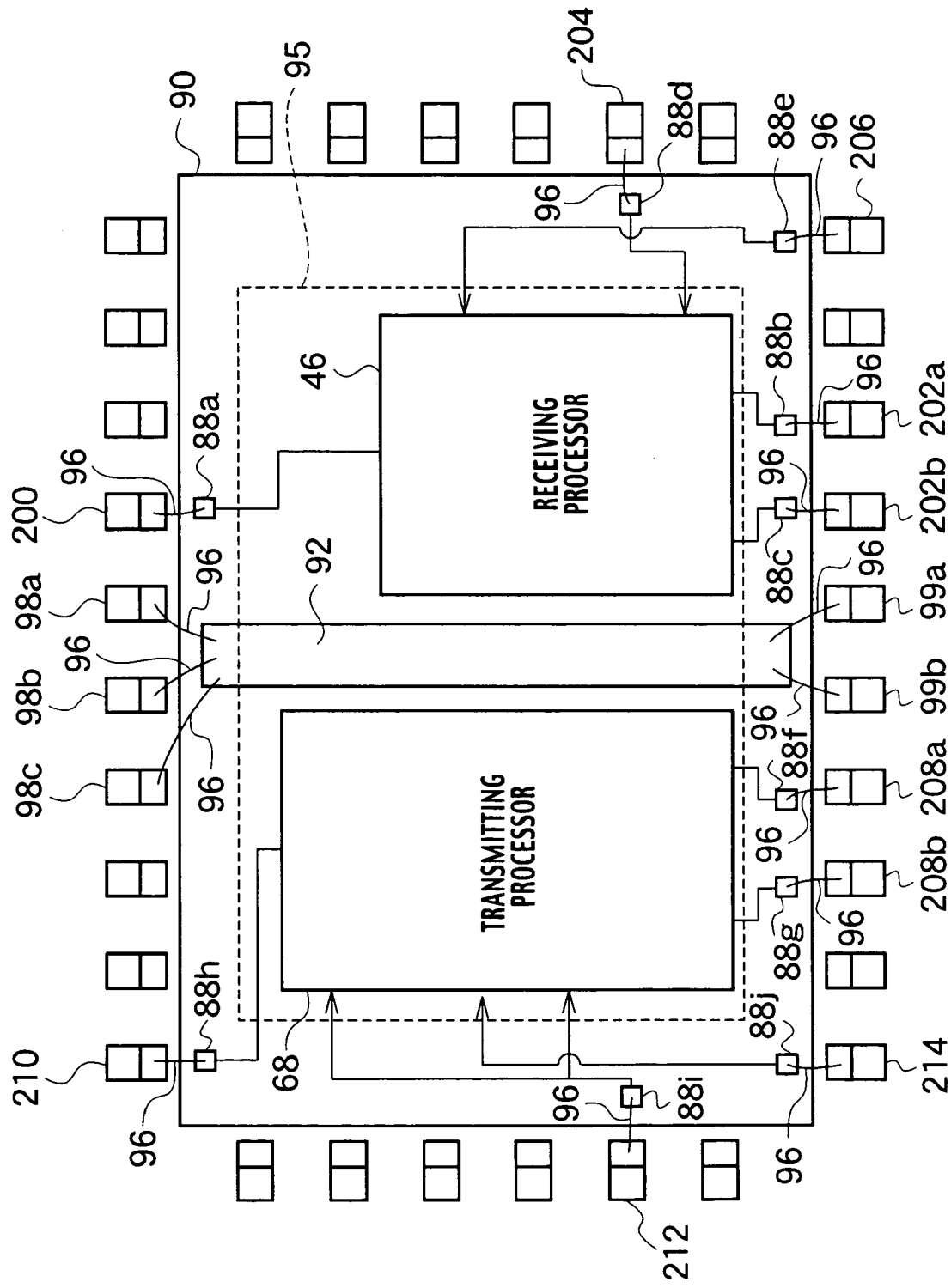
FIG. 3 is a diagram for explaining an example of packaging of the semiconductor device according to the embodiment of the present invention.

For example, as shown in FIG. 3, the semiconductor chip 90 shown in FIG. 2 is die bonded to a die pad 95 of a lead frame of a surface mount type quad flat package (QFP) or the like. Thereafter, using gold (Au) or the like bonding wires 96, the bonding pads 88a to 88j are connected to a receiving input terminal 200, receiving output terminals 202a and 202b, a receiving gain control terminal 204, a receiving LO control terminal 206, transmitting input terminals 208a and 208b, a transmitting output terminal 210, a transmitting gain control terminal 212, and a transmitting LO control terminal 214, respectively. An end of the ground region 92 in the upper end of the semiconductor chip 90 is connected to first ground terminals 98a, 98b, and 98c placed between the receiving input terminal 200 and the transmitting output terminal 210, using the bonding wires 96. Moreover, the other end of the ground region 92 in the lower end of the semiconductor chip 90 is connected to second ground terminals 99a and 99b placed or located between the region of the receiving output terminals 202a and 202b and the region of the transmitting input terminals 208a and 208b, using the bonding wires 96.

The ground region 92 provided in the semiconductor chip 90 is connected to a ground plane (not shown) of the wireless communication apparatus through the first and second ground terminals 98a to 98c and 99a, 99b bonded to the ground region 92 using the bonding wires 96. In order to reduce the resistance between the ground region 92 and the ground plane of the wireless communication apparatus, it is desired that the number of first and second ground terminals 98a to 98c and 99a and 99b is as many as possible. Moreover, the first ground terminals 98*a* and 98*b* are placed so as to face the second ground terminals 99*a* and 99*b* across the semiconductor chip 90.

After the semiconductor chip 90 has been bonded to the lead frame, the semiconductor chip 90 and the bonding wires 96 are sealed in a package (not shown) of epoxy resin or the like. Thus, a semiconductor device is formed as a processor unit in which transmitting and receiving circuits are monolithically integrated. As shown in FIG. 2, in the semiconductor device according to the embodiment, the ground region 92 is placed between the receiving processor 46 and the transmitting processor 68. A leakage signal, which is an electrical noise from the RF transmitting signal or the baseband transmitting signal transmitted in the transmitting processor 68, is absorbed by the ground region 92.

Figure 4:
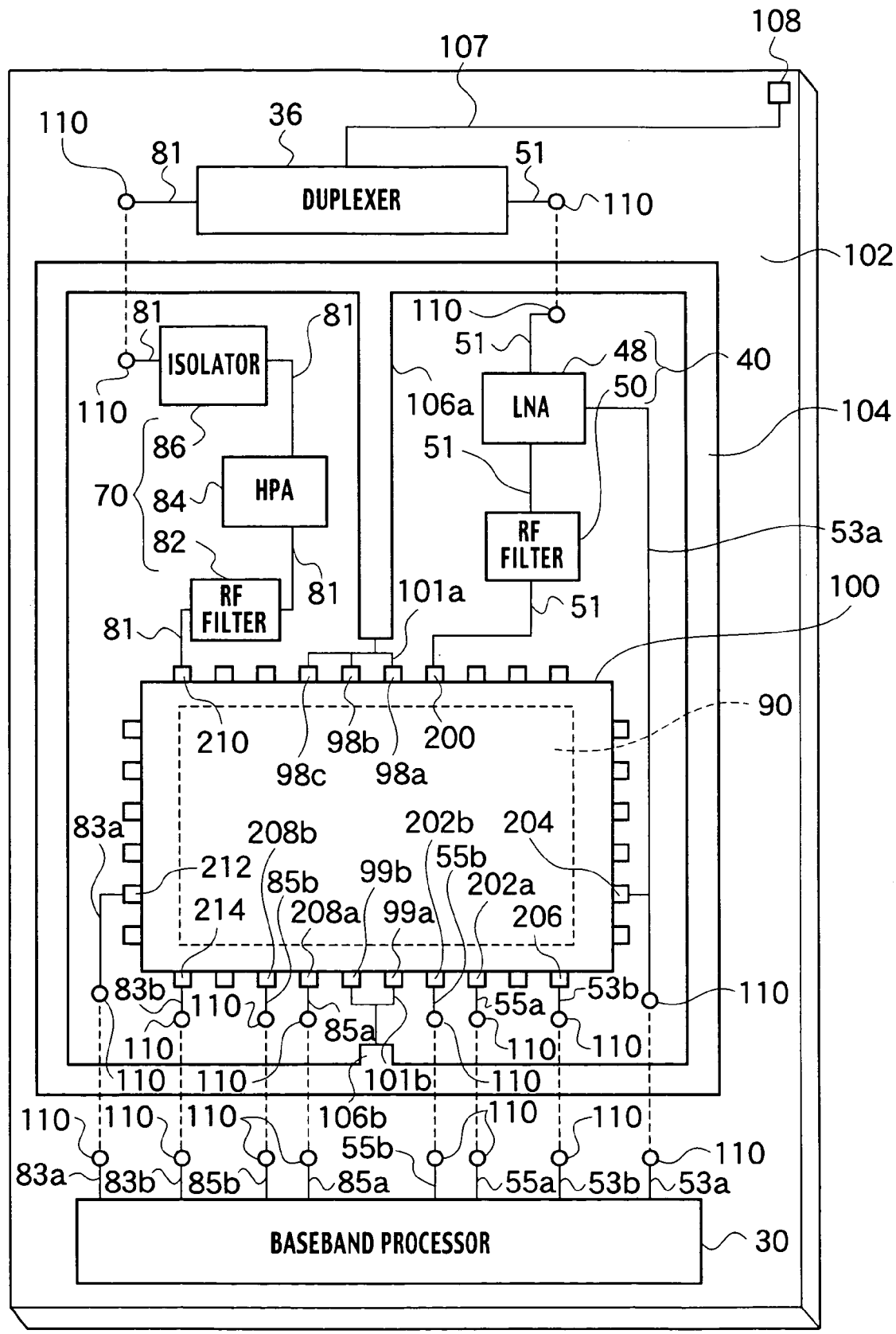
FIG. 4 is a diagram showing an example of an assembly of the wireless communication apparatus according to the embodiment of the present invention.

As shown in FIG. 4, a transmitting/receiving circuit placed on a mounting substrate 102 such as a printed circuit board, a ceramic substrate and the like, of the wireless communication apparatus according to the embodiment includes an antenna terminal 108 provided near a corner on an end of the mounting substrate 102, the duplexer 36 placed in a vicinity of the end of the mounting substrate 102, the receiving amplifier 40 and the transmitting amplifier 70 placed in parallel from the duplexer 36 toward the other end of the mounting substrate 102, a processor unit 100 placed so as to face the duplexer 36 across the receiving amplifier 40 and the transmitting amplifier 70, and the baseband processor 30 placed in a vicinity of the other end of the mounting substrate 102 so as to face the processor unit 100. Here, the processor unit 100 corresponds to the semiconductor device shown in FIGS. 2 and 3. The receiving amplifier 40, the transmitting amplifier 70, and the processor unit 100 are located in a region between the duplexer 36 and the baseband processor 30, which is surrounded by a peripheral shield ground section 104 formed of a conductive layer of Au, copper (Cu), or the like. Between the receiving amplifier 40 and the transmitting amplifier 70, a partitioning shield ground section 106*a* connected to the peripheral shield ground section 104 is provided, which is formed of a conductive layer extending to the vicinity of the processor unit 100. Moreover, a partitioning shield ground section 106*b* connected to the peripheral shield ground section 104, which is formed of a conductive layer extending to the vicinity of the processor unit 100, is provided at a position facing the partitioning shield ground section 106*a* across the processor unit 100.

The antenna terminal 108 is connected to the duplexer 36 using an RF signal line 107. The duplexer 36 is connected to the receiving input terminal 200 of the processor unit 100 through the LNA 48 and the RF filter 50 of the receiving amplifier 40 using a receiving RF signal line 51. Moreover, the duplexer 36 is connected to the transmitting output terminal 210 of the processor unit 100 through the isolator 86, the HPA 84, and the RF filter 82 of the transmitting amplifier 70 using a transmitting RF signal line 81. In order to bypass the peripheral shield ground section 104, part of the receiving RF signal line 51 and the transmitting RF signal line 81 are provided in an intermediate layer of the mounting substrate 102 or on the rear surface thereof by through holes 110 provided in the vicinities of the duplexer 36 and the LNA 48, and in the vicinities of the duplexer 36 and the isolator 86, respectively, so as to face each other across the peripheral shield ground section 104. Note that the peripheral shield ground section 104 and the partitioning shield ground sections 106*a* and 106*b* are connected to the ground plane of the wireless communication apparatus, which is provided in the mounting substrate 102.

Moreover, the receiving output terminals 202*a* and 202*b* and the transmitting input terminals 208*a* and 208*b* of the processor unit 100 are connected to the baseband processor 30 using receiving output lines 55*a* and 55*b* and transmitting input lines 85*a* and 85*b*. The receiving gain control terminal 204, the receiving LO control terminal 206, the transmitting gain control terminal 212, and the transmitting LO control terminal 214 are also connected to the baseband processor 30 using control signal lines 53*a*, 53*b*, 83*a*, and 83*b*, respectively. The control signal line 53*a* is further connected to the LNA 48 from the receiving gain control terminal 204. Similar to the receiving RF signal line 51 and the transmitting RF signal line 81, the receiving output lines 55*a* and 55*b*, the transmitting input lines 85*a* and 85*b*, and the control signal lines 53*a*, 53*b*, 83*a*, and 83*b* are also individually interconnected so as to bypass the peripheral shield ground section 104 by the through holes 110. In addition, the first ground terminals 98*a* to 98*c* of the processor unit 100 are connected to the partitioning shield ground section 106*a* using ground lines 101*a*. Further, the second ground terminals 99*a* and 99*b* of the processor unit 100 are connected to the partitioning shield ground section 106*b* using ground lines 101*b*.

Figure 5:
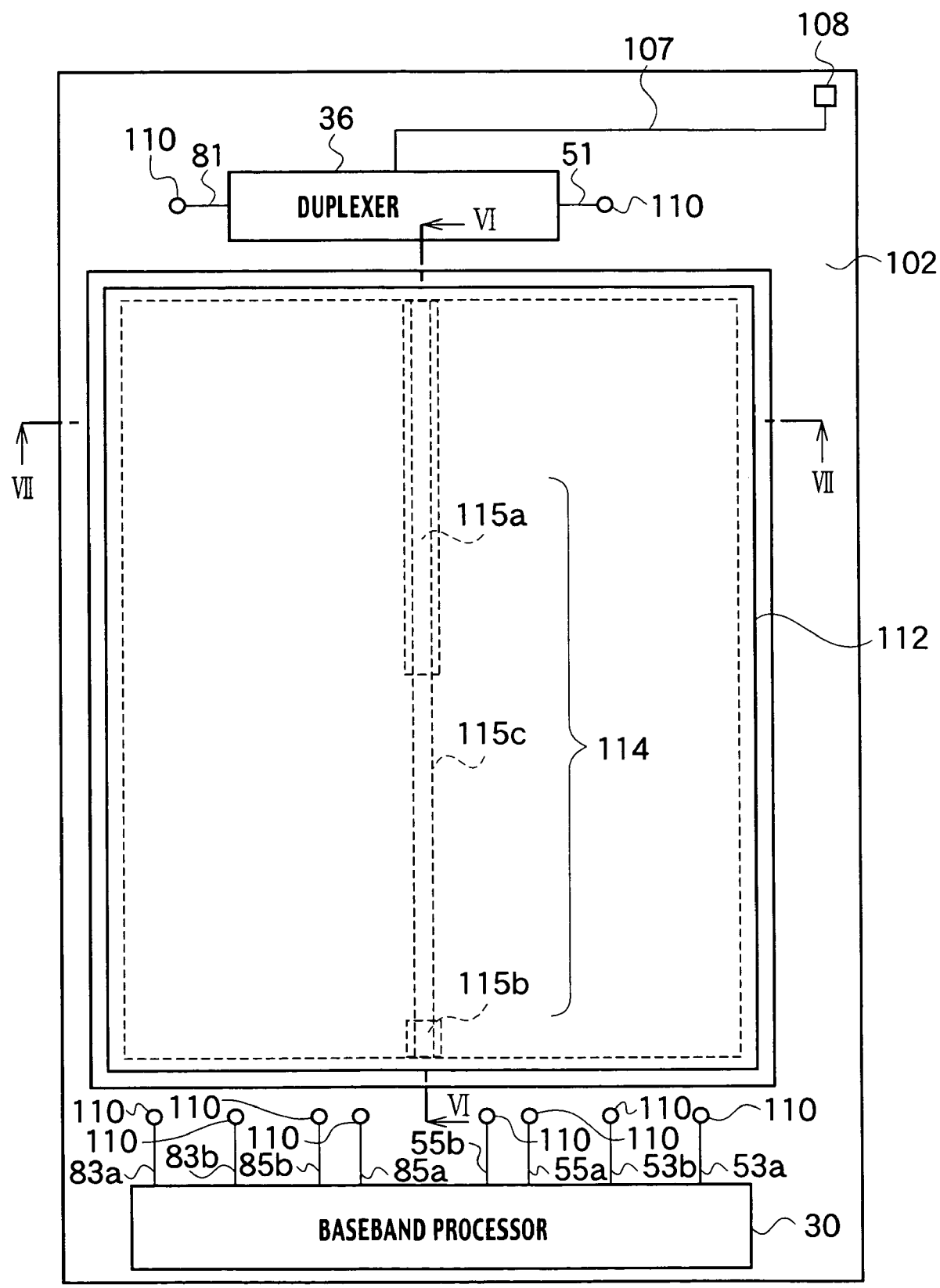
FIG. 5 is a diagram showing an example of shielding of the wireless communication apparatus according to the embodiment of the present invention.

As shown in FIG. 5, in the mounting substrate 102, a shield case 112 and a shield partition 114 of conductors of metal or the like, are provided so as to electrically contact the peripheral shield ground section 104 and the partitioning shield ground sections 106*a* and 106*b*. Thus, the shield case 112 and the shield partition 114 are connected to the ground plane of the wireless communication apparatus through the peripheral shield ground section 104 and the partitioning shield ground sections 106*a* and 106*b*. The shield partition 114 has a first partition 115*a* which separates the receiving amplifier 40 and the transmitting amplifier 70 shown in FIG. 4, a second partition 115*b* provided so as to face the first partition 115*a* across the processor unit 100, and a cut 115*c* provided so as to be laid across the processor unit 100.

As shown in FIG. 6, which is VI-VI cross-sectional view of FIG. 5 taken along the shield partition 114, and as shown in FIG. 7, which is VII-VII cross-sectional view of FIG. 5 taken along the direction orthogonal to the longitudinal direction of the first partition 115*a*, the shield case 112 is an enclosure for covering the receiving amplifier 40, the transmitting amplifier 70, and the processor unit 100. As shown in FIG. 6, the shield partition 114 is provided in contact with a side panel and a top panel of the shield case 112 without a gap therebetween. A gap 116 between the processor unit 100 sealed in a package 97 and each of the first partitions 115*a*, the second partitions 115*b*, and the cut 115*c* of the shield partition 114 is a space corresponding to an assembly margin, based on manufacturing error and the assembly error of the processor unit 100. As shown in FIG. 7, the first partition 115*a* is provided in contact with the top panel of the shield case 112 and the partitioning shield ground section 106*a* so as to spatially shield the receiving amplifier 40 and the transmitting amplifier 70 from each other.

As described previously, in the embodiment of the present invention, since the processor unit 100 of a transceiver monolithic IC is used, the wireless communication apparatus can be miniaturized. Moreover, the shield case 112 and the shield partition 114 are the conductors connected to the ground plane of the wireless communication apparatus. Therefore, interference waves from external wireless communication apparatuses to the receiving amplifier 40 in the receiving unit 32, the transmitting amplifier 70 in the transmitting unit 34, and the processor unit 100 can be shielded by the shield case 112. Further, the first partition 105*a* of the shield partition 114 makes it possible to suppress the direct interference from spurious signals and the like emitted from the transmitting amplifier 70, to the receiving amplifier 40. Since the gap 116 in the shield partition 114 is suppressed to a level corresponding to the assembly margin of the processor unit 100, electromagnetic disturbance waves leaking from the transmitting unit 34 to the receiving unit 32 can be reduced. Furthermore, since the ground region 92 of the processor unit 100 provides isolation between the receiving processor 46 and the transmitting processor 68, it is possible to prevent electrical deterioration of the receiving processor 46 by a leakage signal from an RF transmitting signal or a baseband transmitting signal in the transmitting processor 68. Thus, in the wireless communication apparatus according to the embodiment of the present invention, miniaturization can be achieved by using the processor unit 100 of a transceiver monolithic IC, and the deterioration of receiving characteristics of the receiving unit 32 can be reduced by suppressing disturbance waves and leakage signals entering the receiving unit 32 from the transmitting unit 34.

Figure 8:
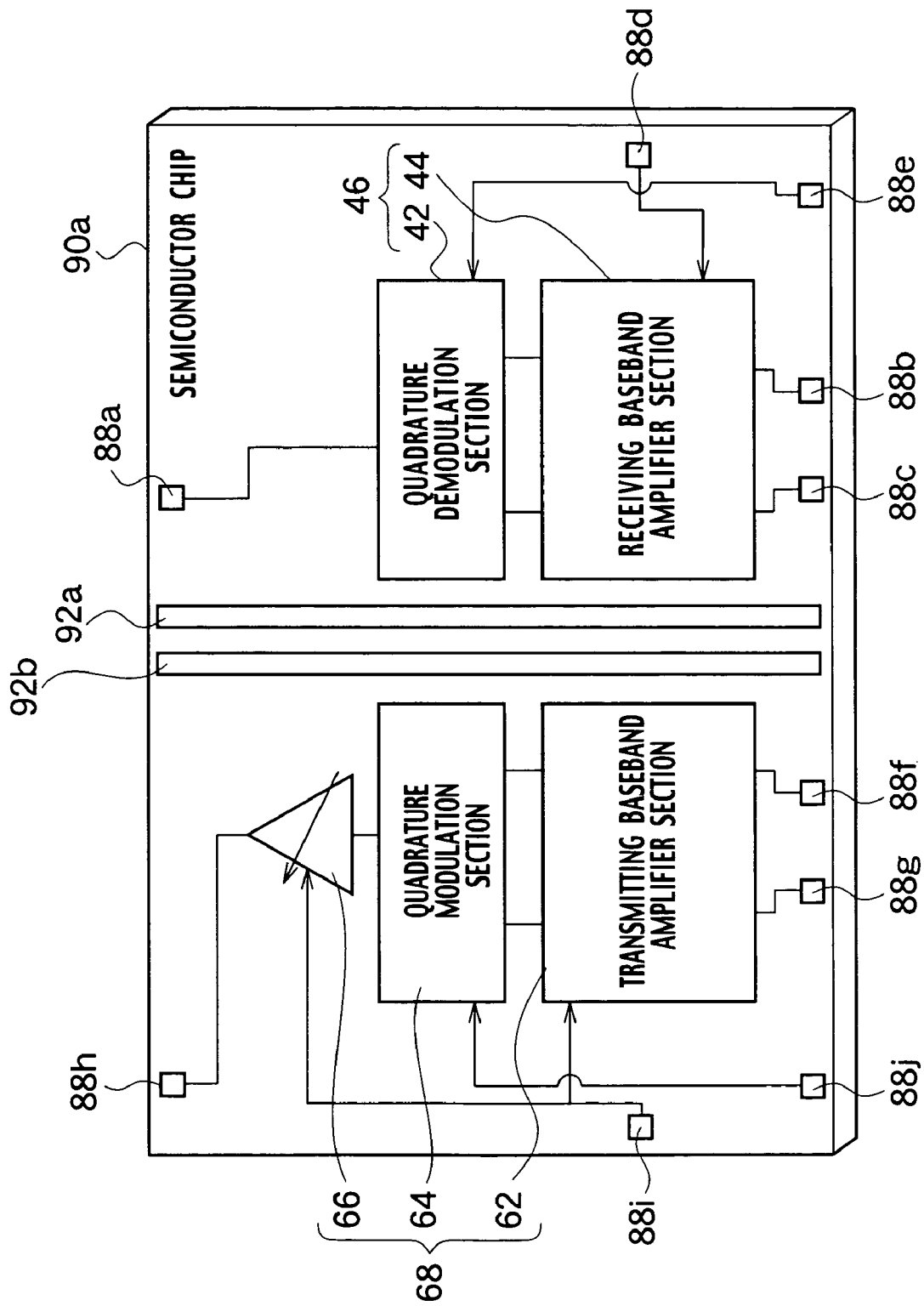
FIG. 8 is a diagram showing another example of a semiconductor chip of the semiconductor device according to the embodiment of the present invention.

As shown in FIG. 2, in the semiconductor chip 90 used for the above explanation, the ground region 92 is provided as a common ground of the receiving processor 46 and the transmitting processor 68 so as to extend from one end of the semiconductor chip 90 to the other end thereof. For example, as shown in FIG. 8, a receiving ground region 92a and a transmitting ground region 92b which are respectively dedicated to the receiving processor 46 and the transmitting processor 68 may be provided between the receiving processor 46 and the transmitting processor 68 in a semiconductor chip 90a. Since the grounds of the receiving processor 46 and the transmitting processor 68 are separated as the receiving ground region 92a and the transmitting ground region 92b, it is possible to suppress the interference from an RF transmitting signal or a baseband transmitting signal of the transmitting processor 68 to the receiving processor 46 through the grounds. Therefore, the deterioration of receiving characteristics of the receiving processor can be more efficiently prevented.

Figure 9:
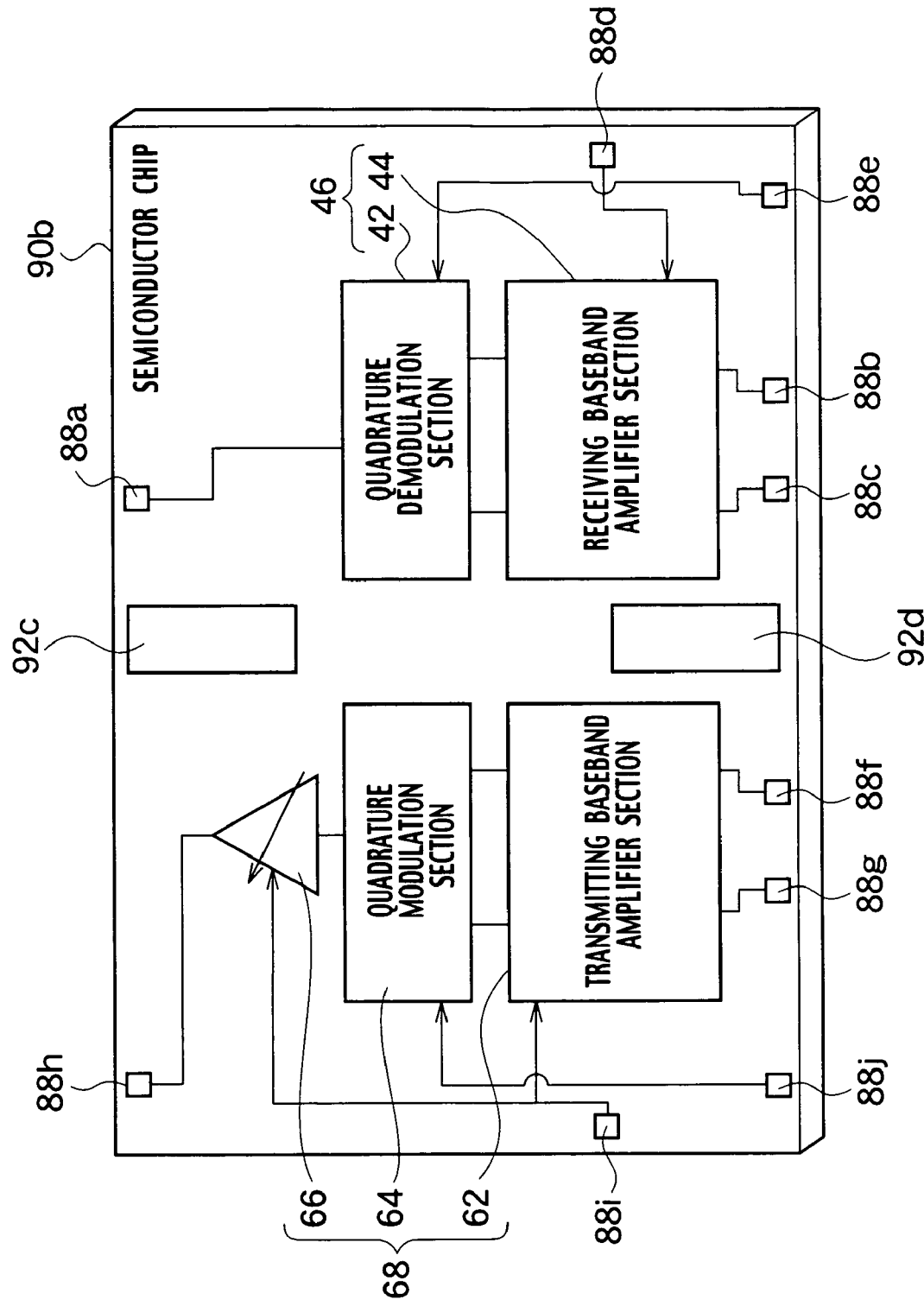
FIG. 9 is a diagram showing another example of a semiconductor chip of the semiconductor device according to the embodiment of the present invention.

Moreover, depending on the circuit pattern layout of the receiving processor 46 and the transmitting processor 68 of the processor unit 100, there are cases where the ground region 92 cannot be placed so as to extend from one end of the semiconductor chip 90 to the other end thereof as shown in FIG. 2. For example, as shown in FIG. 9, a first ground region 92c between the input section of the quadrature demodulation section 42 and the RF amplifier 66, and a second ground region 92d between the receiving baseband amplifier section 44 and the transmitting baseband amplifier section 62 may be provided in a semiconductor chip 90b. The interference from a RF transmitting signal can be prevented by the first ground region 92c, and the interference from a baseband transmitting signal can be prevented by the second ground region 92d. Alternatively, only the first ground region 92c may be provided between the input section of the quadrature demodulation section 42 of the receiving processor 46 and the RF amplifier 66 of the transmitting processor 68. At the output section of the RF amplifier 66, the intensity of an RF transmitting signal becomes maximum in the transmitting processor 68, and the interference to the input section of the quadrature demodulation section 42 in which an RF receiving signal is transmitted becomes strongest. Therefore, the deterioration of receiving characteristics of the receiving processor 46 due to an RF transmitting signal can be suppressed by appropriate placement of the first ground region 92c.

Figure 10:
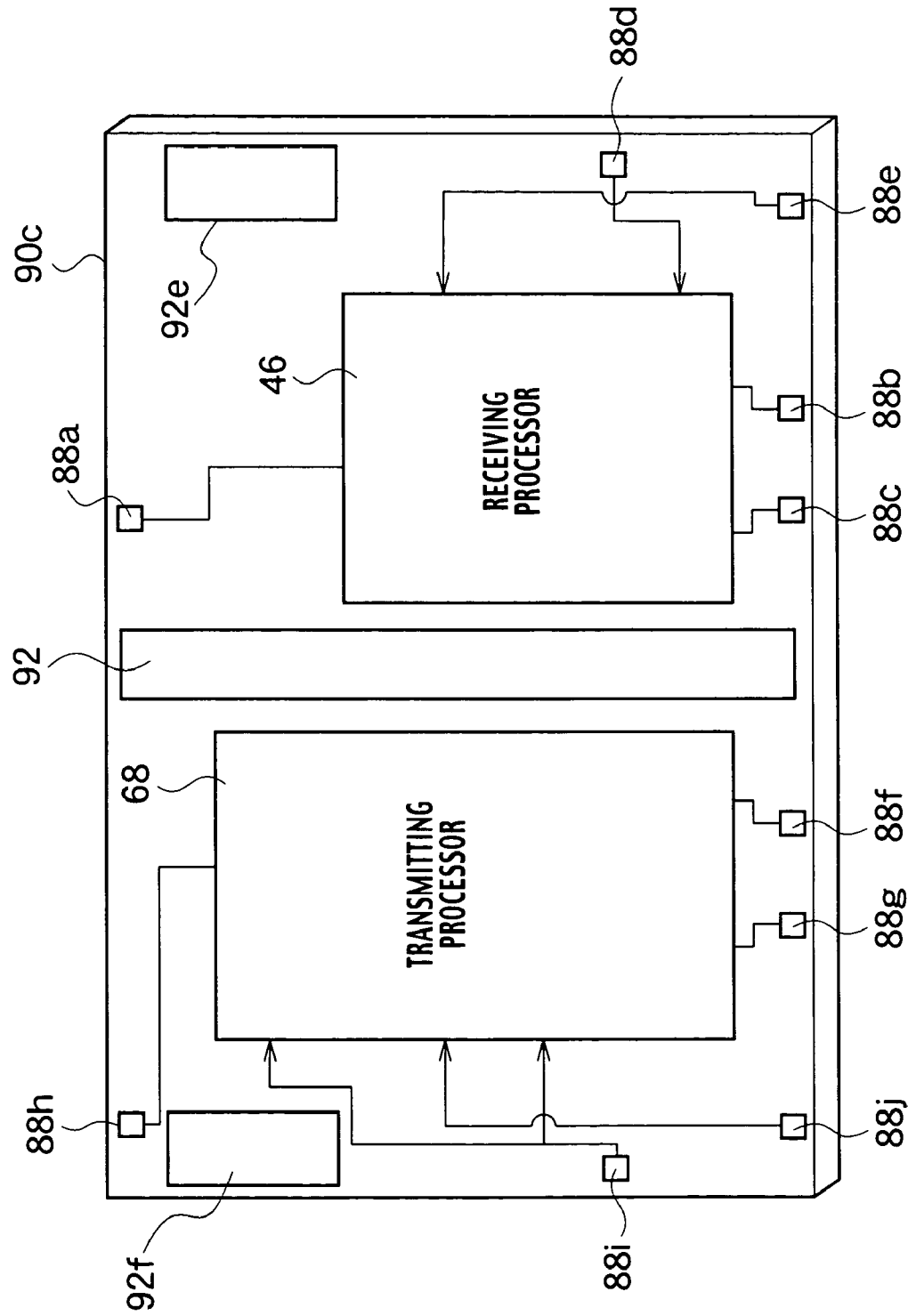
FIG. 10 is a diagram showing another example of a semiconductor chip of the semiconductor device according to the embodiment of the present invention.
Figure 11:
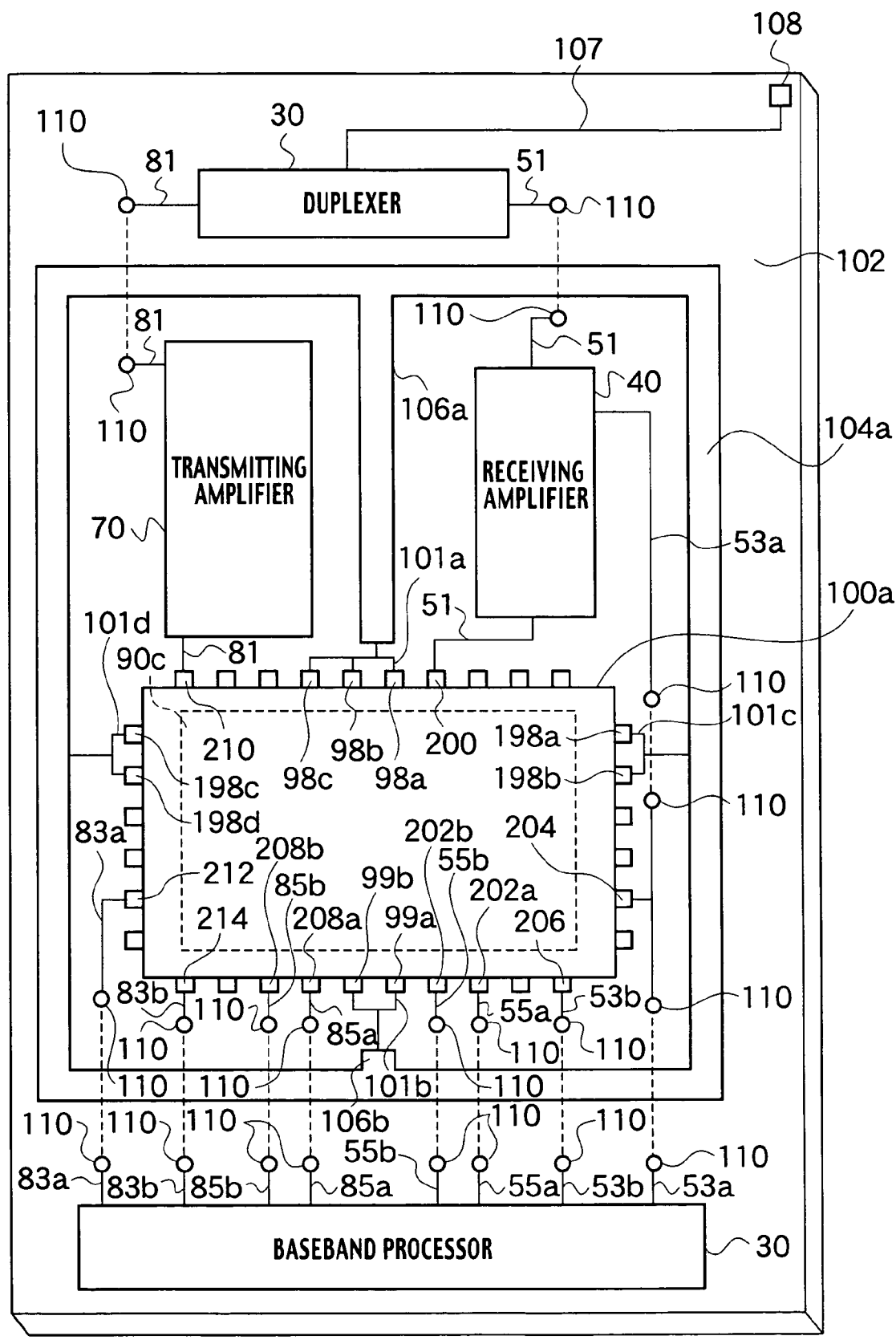
FIG. 11 is a diagram showing an example of mounting of a semiconductor device having the semiconductor chip shown in FIG. 10 is mounted.

Further, as shown in FIG. 10, in a semiconductor chip 90c used for the wireless communication apparatus of the embodiment, in addition to the ground region 92 located between the receiving processor 46 and the transmitting processor 68, a receiving side ground region 92e and a transmitting side ground region 92f may be provided at a region of the input section of an RF receiving signal of the receiving processor 46 and a region of the output section of an RF transmitting signal of the transmitting processor 68, in the vicinities of edges of the semiconductor chip 90c, respectively. As shown in FIG. 11, the receiving side ground region 92e and the transmitting side ground region 92f are bonded to third terminals 198a, 198b, 198c, and 198d placed close to an upper end of the processor unit 100a in the drawing where the receiving input terminal 200 and the transmitting output terminal 210 are placed, on left and right edges of the processor unit 10a in the drawing. The third terminals 198a, 198b, 198c, and 198d are connected to the peripheral shield ground section 104a by ground lines 101c and 101d. Therefore, a leakage signal from the RF transmitting signal entering a rear surface of the semiconductor chip from the transmitting processor 68 can be suppressed, and the deterioration of receiving characteristics can be prevented.

Figure 12:
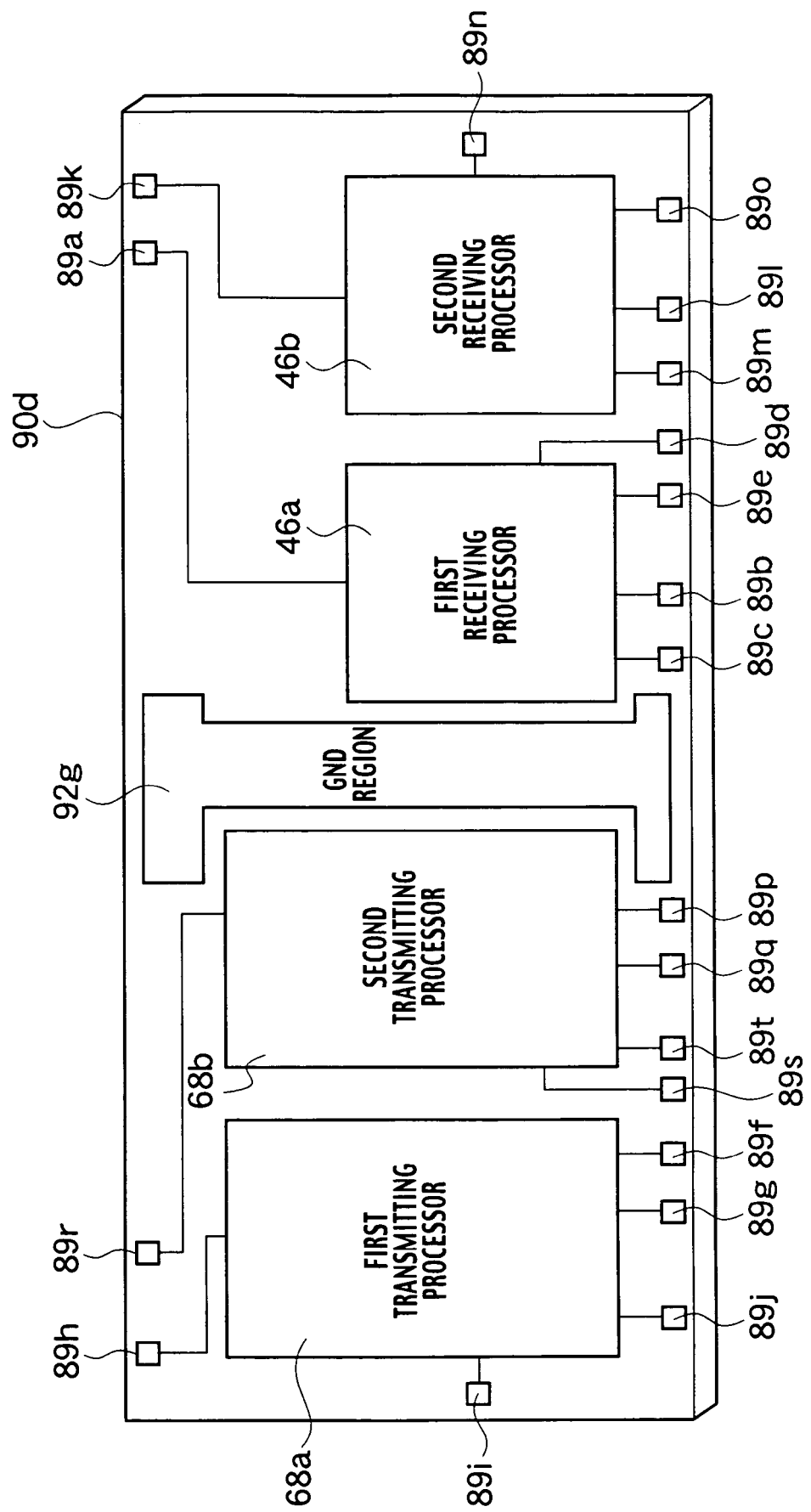
FIG. 12 is a diagram showing another example of a semiconductor chip of the semiconductor device according to the embodiment of the present invention.

In the aforementioned processor unit 100 of a transceiver monolithic IC, a transceiver circuit is provided which has one pair of processors containing the receiving processor 46 and the transmitting processor 68. However, the number of transceiver circuits is not limited to one such pair, and a plurality of transceiver circuits may be provided. For example, as shown in FIG. 12, in a semiconductor chip 90d, a first transmitting processor 68a, a second transmitting processor 68b, a first receiving processor 46a, and a second receiving processor 46b are located in the vicinity of the left periphery of the semiconductor chip 90d and toward the vicinity of the right periphery thereof, as shown in the drawing. The first transmitting processor 68a and the first receiving processor 46a operate as a first transceiver circuit. The second transmitting processor 68b and the second receiving processor 46b operate as a second transceiver circuit. A ground region 92g extending from the vicinity of the upper end of the semiconductor chip 90d to the vicinity of the lower end thereof, as shown in the drawing, is provided between the region where the first and second transmitting processors 68a and 68b are located and the region where the first and second receiving processors 46a and 46b are located. The first and second transmitting processors 68a and 68b and the first and second receiving processors 46a and 46b have similar configurations to those of the transmitting processor 68 and the receiving processor 46 shown in FIG. 2.

In the vicinity of the upper end of the semiconductor chip 90d, bonding pads 89h and 89r are provided for RF transmitting signal output of the first and second transmitting processors 68a and 68b, and bonding pads 89a and 89k are provided for RF receiving signal input of the first and second receiving processors 46a and 46b. In the vicinity of the lower end of the semiconductor chip 90d, bonding pads 89g, 89f, 89p, and 89q are provided for baseband transmitting signal input of the first and second transmitting processors 68a and 68b, and bonding pads 89b, 89c, 89l, and 89m are provided for baseband receiving signal output of the first and second receiving processors 46a and 46b. Further, in the vicinity of the lower end of the semiconductor chip 90d, a bonding pad 89j is provided for a transmitting LO control signal of the first transmitting processor 68a, bonding pads 89s and 89t are provided for a transmitting gain control signal and a transmitting LO control signal of the second transmitting processor 68b, bonding pads 89d and 89e are provided for a receiving gain control signal and a receiving LO control signal of the first receiving processor 46a, and a bonding pad 89o is provided for a receiving LO control signal of the second receiving processor 46b. In addition, a bonding pad 89*i* for a transmitting gain control signal of the first transmitting processor 68*a* is provided in the vicinity of the left periphery of the semiconductor chip 90*d*, and a bonding pad 89*n* for a receiving gain control signal of the second receiving processor 46*b* is provided in the vicinity of the right periphery thereof.

The first and second transceiver circuits operate while being switched by a switching control section provided in the baseband processor. The ground region 92*g* of the semiconductor chip 90*d* is provided between the region of the first and second transmitting processors 68*a* and 68*b* of the first and second transceiver circuits and the region of the first and second receiving processors 46*a* and 46*b* thereof. Therefore, since the isolation between transmission and reception is achieved by the ground region 92*g* during the operation of the first or second transceiver circuit, it is possible to prevent the electrical deterioration of the first and second receiving processors 46*a* and 46*b* by leakage signals from RF transmitting signals and baseband transmitting signals of the first and second transmitting processors 68*a* and 68*b*. Additionally, the location where the switching control section for the first and second transceiver circuits is installed is not limited to the baseband processor. For example, the switching control section may be provided in the semiconductor chip 90*d*. In this case, a switching signal is transmitted from the baseband processor to the switching control section provided in the semiconductor chip 90*d*.

(First Modification)

Figure 13:
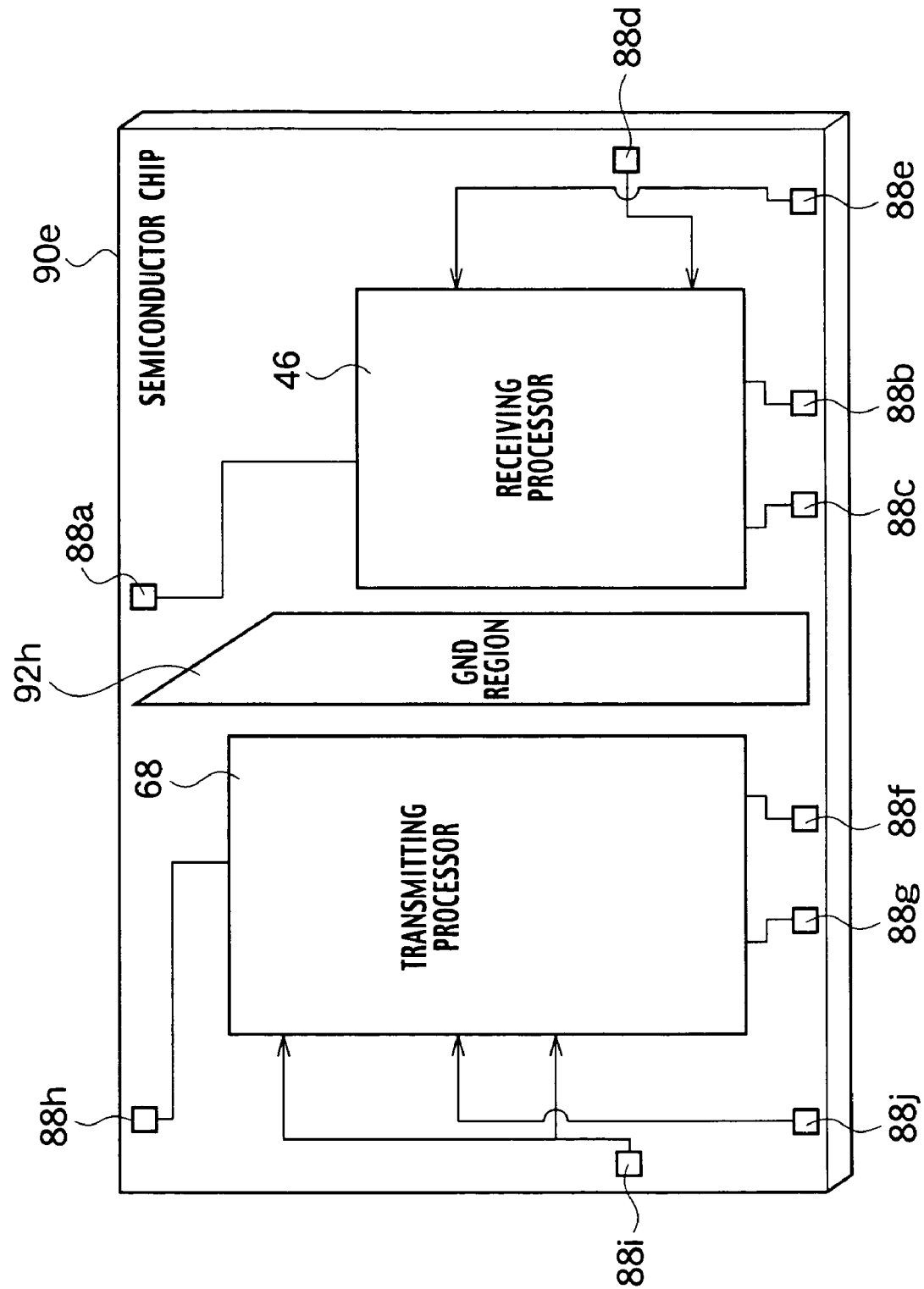
FIG. 13 is a diagram showing an example of a semiconductor chip of a semiconductor device according to a first modification of the embodiment of the present invention.

As shown in FIG. 13, in a semiconductor chip 90*e* used for a wireless communication apparatus according to a first modification of the embodiment of the present invention, the bonding pad 88*a* for the RF receiving signal input of the receiving processor 46 is located in the vicinity of a ground region 92*h* due to the circuit pattern layout. Therefore, the shape of the ground region 92*h* in the vicinity of the bonding pad 88*a* is formed diagonally.

Figure 14:
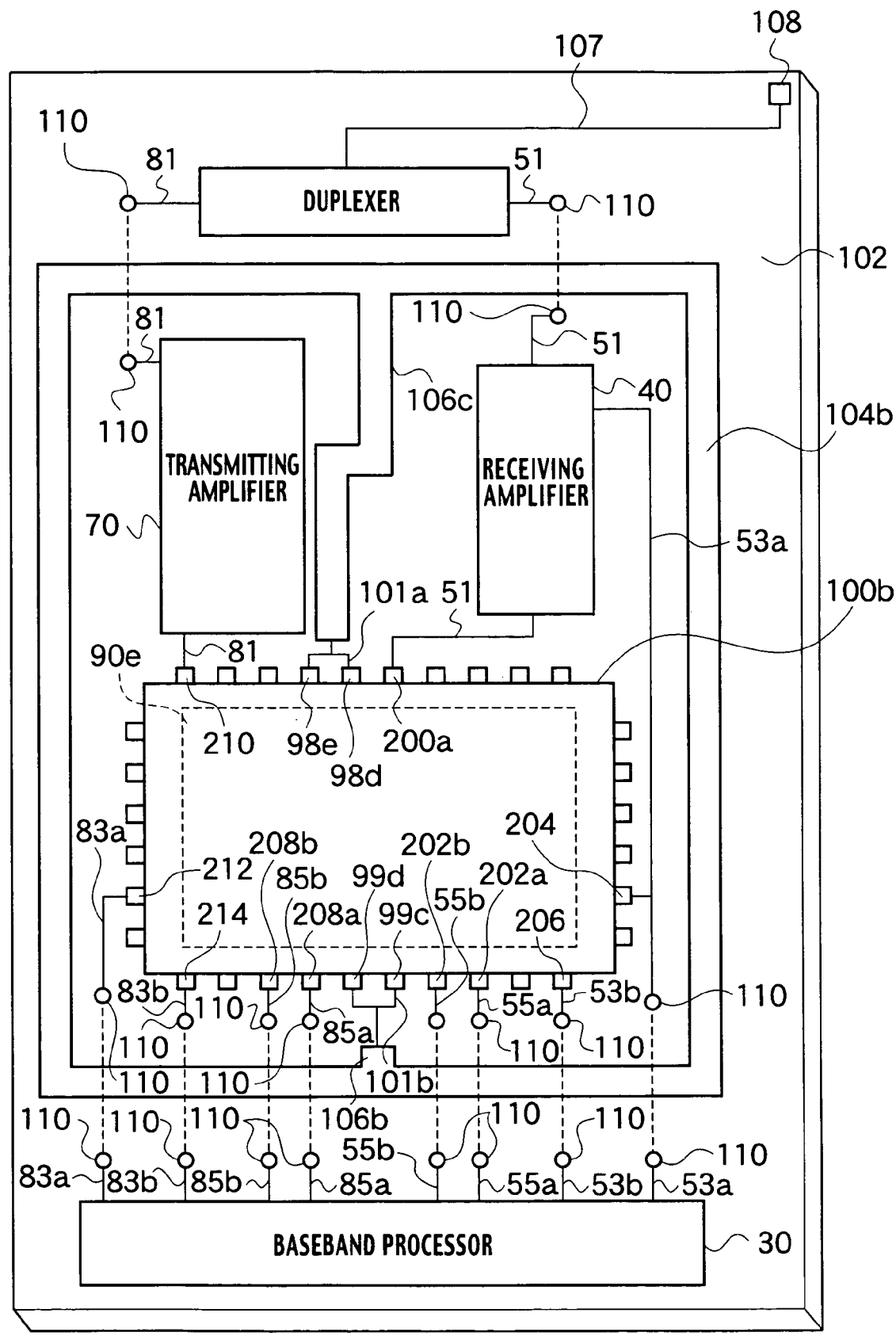
FIG. 14 is a diagram showing an example of mounting of the semiconductor device according to the first modification of the embodiment of the present invention.

In FIG. 14, an example of mounting of a processor unit 100*b* according to the first modification of the embodiment is shown. The bonding pad 88*a* is bonded to a receiving input terminal 200*a*. As a result, first ground terminals 98*d* and 98*e* and second ground terminals 99*c* and 99*d* to which the ground region 92*h* is bonded, face each other in a skewed manner. A partitioning shield ground section 106*c* connected to a peripheral shield ground section 104*b* has a step-type bent portion extending toward the transmitting amplifier 70 between the receiving amplifier 40 and the transmitting amplifier 70, and connected to the first ground terminals 98*d* and 98*e* through ground lines 101*a*. Accordingly, the first modification of the embodiment is different from the embodiment in that the respective end portions of partitioning shield ground sections 106*c* and 106*d* on a side of the processor unit 100*b* face each other in a skewed manner. Other configurations are similar to those of the embodiment. Therefore redundant descriptions will be omitted.

Figure 15:
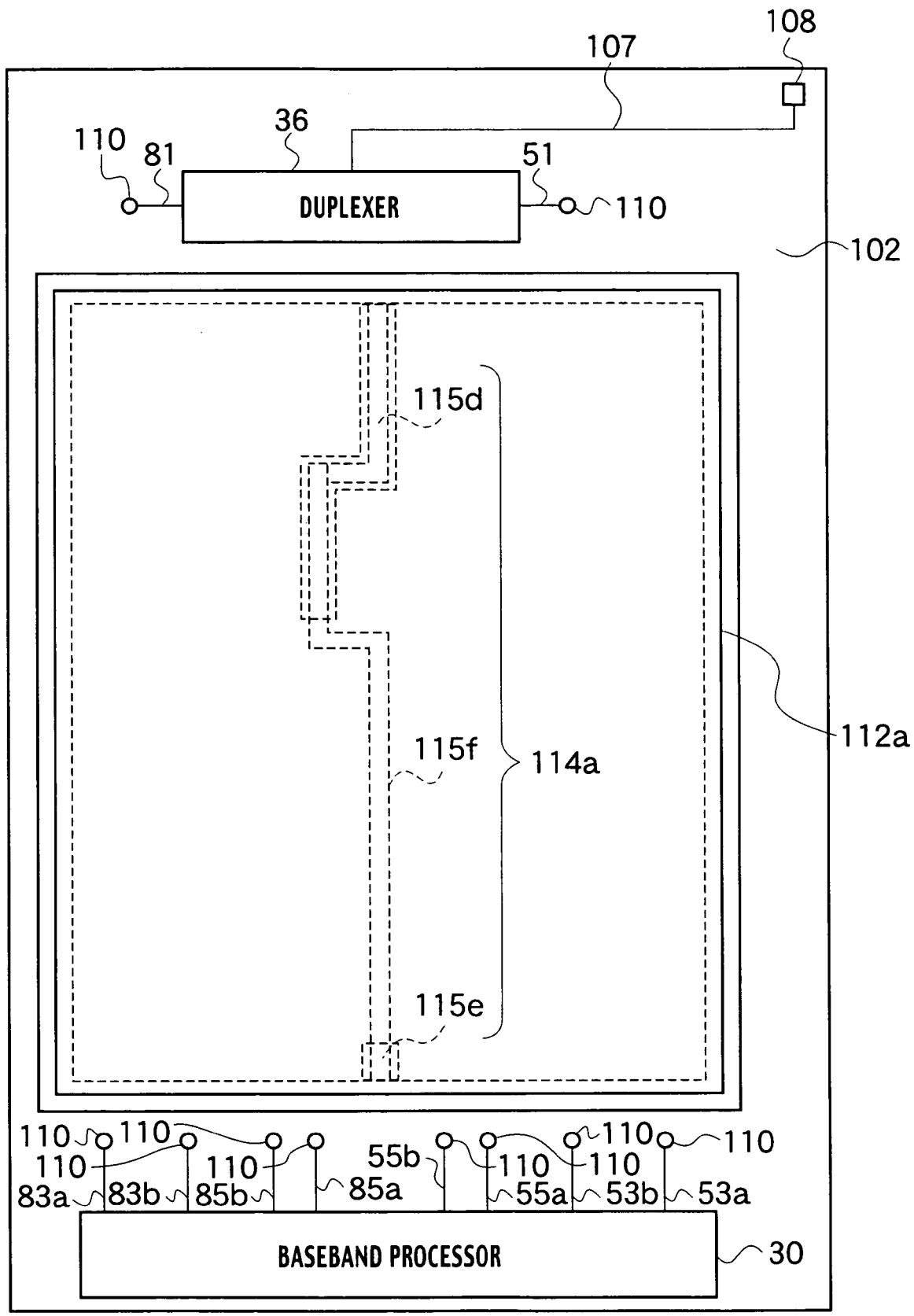
FIG. 15 is a diagram showing an example of shielding of a wireless communication apparatus according to the first modification of the embodiment of the present invention.

As shown in FIG. 15, in the mounting substrate 102, a shield case 112*a* and a shield partition 114*a* are provided on the peripheral shield ground section 104*b* and the partitioning shield ground sections 106*c* and 106*d* shown in FIG. 14. Since a first partition 115*d* of the shield partition 114*a* is provided on the partitioning shield ground section 106*c*, the first partition 115*d* has a step-type bent portion extending toward the transmitting amplifier 70 between the receiving amplifier 40 and the transmitting amplifier 70. Moreover, a cut 115*f* connected to the first partition 115*d* has a step-type bent portion extending toward the receiving amplifier 40, and connected to a second partition 115*e*.

In the first modification of the embodiment, since the processor unit 100*b* of a transceiver monolithic IC is used, the wireless communication apparatus can be miniaturized. Moreover, interference waves from external wireless communication apparatuses to the receiving amplifier 40 in the receiving unit 32, the transmitting amplifier 70 in the transmitting unit 34, and the processor unit 100*b* can be shielded by the shield case 112*a*. Further, the first partition 105*d* of the shield partition 114*a* makes it possible to suppress the direct interference from spurious signals and the like emitted from the transmitting amplifier 70, to the receiving amplifier 40. Furthermore, since the ground region 92*h* of the processor unit 100*b* provides the isolation between the receiving processor 46 and the transmitting processor 68, it is possible to prevent the electrical deterioration of the receiving processor 46 by a leakage signal from an RF transmitting signal or a baseband transmitting signal in the transmitting processor 68. Thus, in the wireless communication apparatus according to the first modification of the embodiment, miniaturization can be achieved using the processor unit 100*b* of a transceiver monolithic IC. Additionally, the deterioration of receiving characteristics of the receiving unit 32 can be reduced by suppressing electromagnetic disturbance waves and leakage signals entering the receiving unit 32 from the transmitting unit 34.

(Second Modification)

Figure 16:
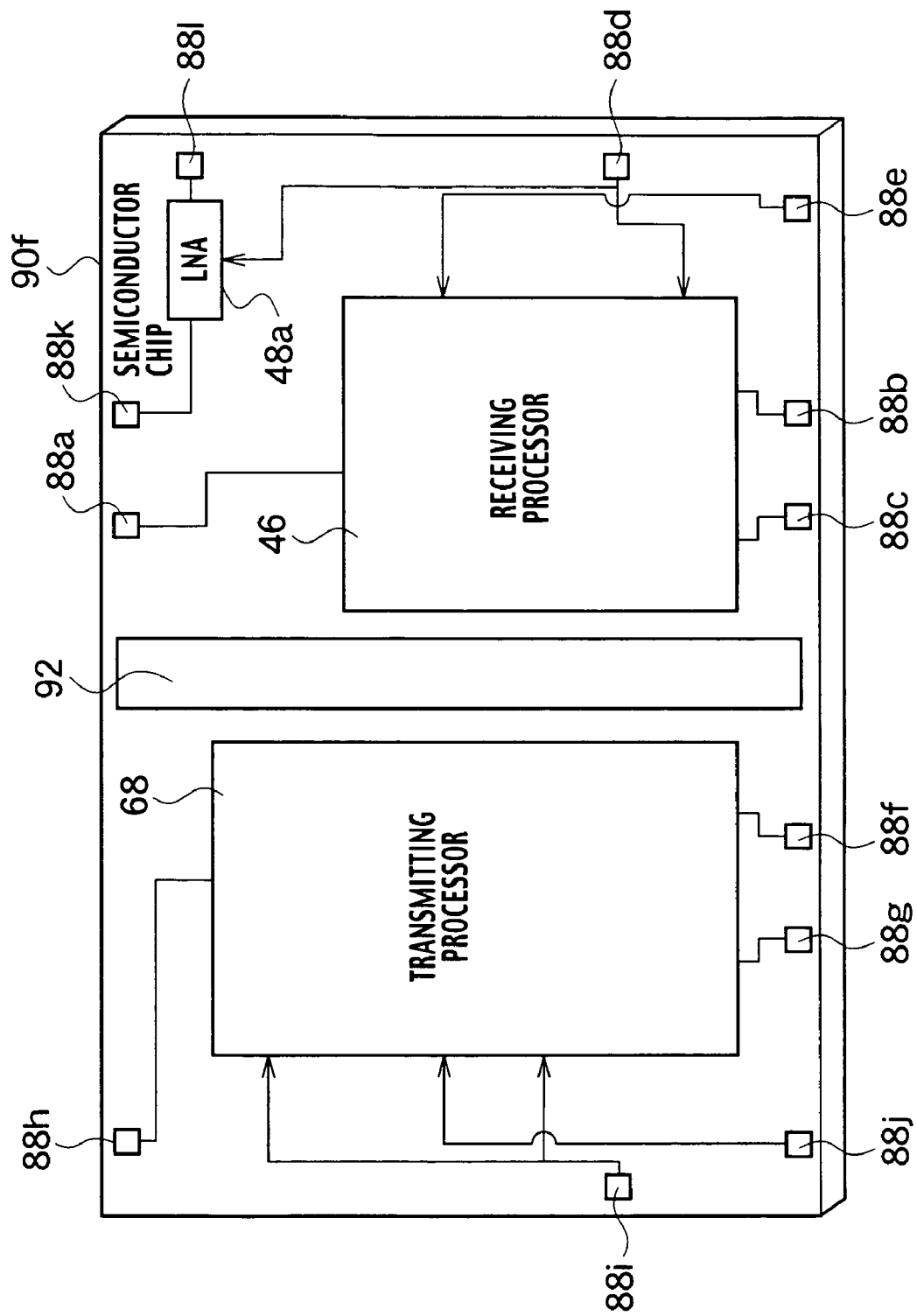
FIG. 16 is a diagram showing an example of a semiconductor chip of a semiconductor device according to a second modification of the embodiment of the present invention.

As shown in FIG. 16, in a semiconductor chip 90*f* used for a wireless communication apparatus according to a second modification of the embodiment of the present invention, an LNA 48*a* is built in the vicinity of a right periphery on the input side of the receiving processor 46. Bonding pads 88*k* and 88*l* for the signal output and input of the LNA 48*a* are placed in the vicinity of the bonding pad 88*a* for the signal input of the receiving processor 46 and in the vicinity of the right periphery on the input side of the semiconductor chip 90*f*, respectively. Since the LNA 48*a* is integrated with the receiving processor 46 of the semiconductor chip 90*f*, a peripheral shield ground section 104*c* on the receiving side can be decreased in size to the vicinity of the position where the RF filter 50 is placed. Accordingly, the peripheral shield ground section 104*c* has a step-type bent portion toward the RF filter 50 in the region where the RF filter 50 on the receiving side and the transmitting amplifier 70 are separated. The duplexer 36 is placed in a region on the receiving side which faces the transmitting amplifier 70 in the step-type bent portion of the peripheral shield ground section 104*c*. Therefore, a mounting substrate 102*a* can be miniaturized. The second modification of the embodiment is different from the embodiment in that the duplexer 36 is provided on the receiving side and the mounting substrate 102*a* is miniaturized using a processor unit 100*c* in which the LNA 48*a* is integrated in the semiconductor chip 90*f*. Other configurations are similar to those of the embodiment. Therefore redundant descriptions will be omitted.

The receiving RF signal line 51 connected to the duplexer 36 is interconnected to an LNA input terminal 218 bonded to the bonding pad 88*l* for the signal input of the LNA 48*a* so as to bypass the peripheral shield ground section 104*c* by through holes 110. The input section of the RF filter 50 is connected to the LNA input terminal 216 bonded to the bonding pad 88*k* for the signal input of the LNA 48*a*, and the output section of the RF filter 50 is connected to the receiving input terminal 200 of the processor unit 100*c*. Moreover, the transmitting RF signal line 81 connected to the duplexer 36 is connected to the transmitting amplifier 70 so as to bypass the peripheral shield ground section 104 by the through holes 110.

A partitioning shield ground section 106e is provided between the RF filter 50 on the receiving side and the transmitting amplifier 70, and connected to the first ground terminals 98a to 98c using the ground lines 101a. A partitioning shield ground section 106f facing the partitioning shield ground section 106e across the processor unit 100c is connected to the second ground terminals 99a and 99b using the ground lines 101b.

Figure 17:
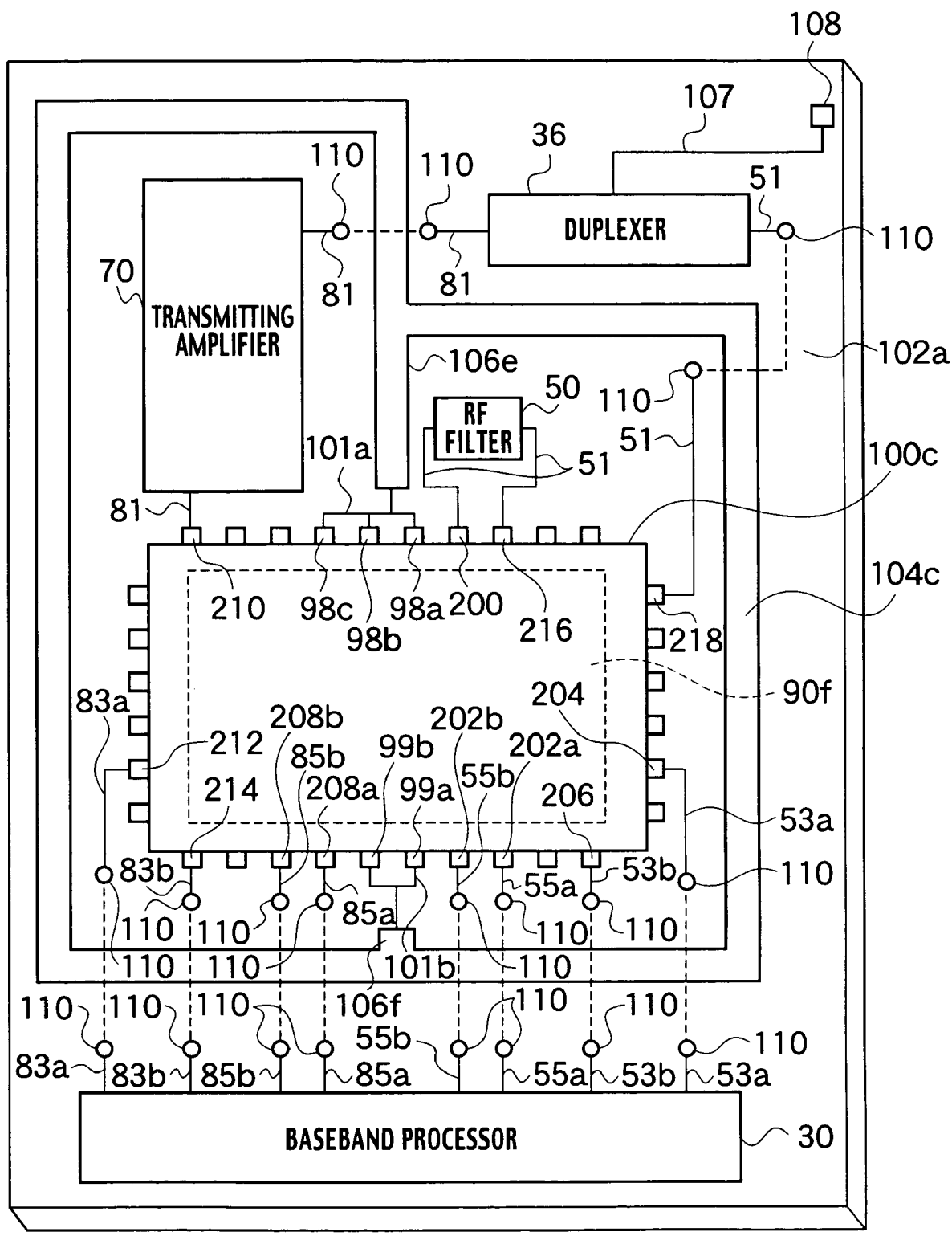
FIG. 17 is a diagram showing an example of mounting of the semiconductor device according to the second modification of the embodiment of the present invention.

In the second modification of the embodiment, on the mounting substrate 102a, a shield case and a shield partition (not shown) are provided on the peripheral shield ground section 104c and the partitioning shield ground sections 106e and 106f shown in FIG. 17. The shield case is provided along the peripheral shield ground section 104c having a step-type bent portion in the region where the RF filter 50 on the receiving side and the transmitting amplifier 70 are separated. The shield partition has a first partition which separates the RF filter 50 and the transmitting amplifier 70 shown in FIG. 17, a second partition provided so as to face the first partition across the processor unit 100c, and a cut provided so as to be laid across the processor unit 100c.

In the second modification of the embodiment, since the processor unit 100c of a transceiver monolithic IC in which the LNA 48a is integrated on the receiving side is used, the region of the receiving side can be decreased in size, and the wireless communication apparatus can be miniaturized. Moreover, interference waves from external wireless communication apparatuses to the RF filter 50 and the transmitting amplifier 70, which are placed in the receiving unit 32 and the transmitting unit 34, and to the processor unit 100c can be shielded by the shield case. Further, the first partition of the shield partition makes it possible to suppress direct interference from spurious signals and the like emitted from the transmitting amplifier 70, to the RF filter 50. Furthermore, since the ground region 92 of the processor unit 100c provides an isolation between the transmitting processor 68 and each of the LNA 48a and the receiving processor 46, it is possible to prevent electrical deterioration of the LNA 48a and the receiving processor 46 by a leakage signal from a RF transmitting signal or a baseband transmitting signal in the transmitting processor 68. Thus, in the wireless communication apparatus according to the second modification of the embodiment, miniaturization can be achieved using the processor unit 100c of a transceiver monolithic IC, and the deterioration of receiving characteristics of the receiving unit 32 can be reduced by suppressing electromagnetic disturbance waves and leakage signals entering the receiving unit 32 from the transmitting unit 34.

(Third Modification)

Figure 18:
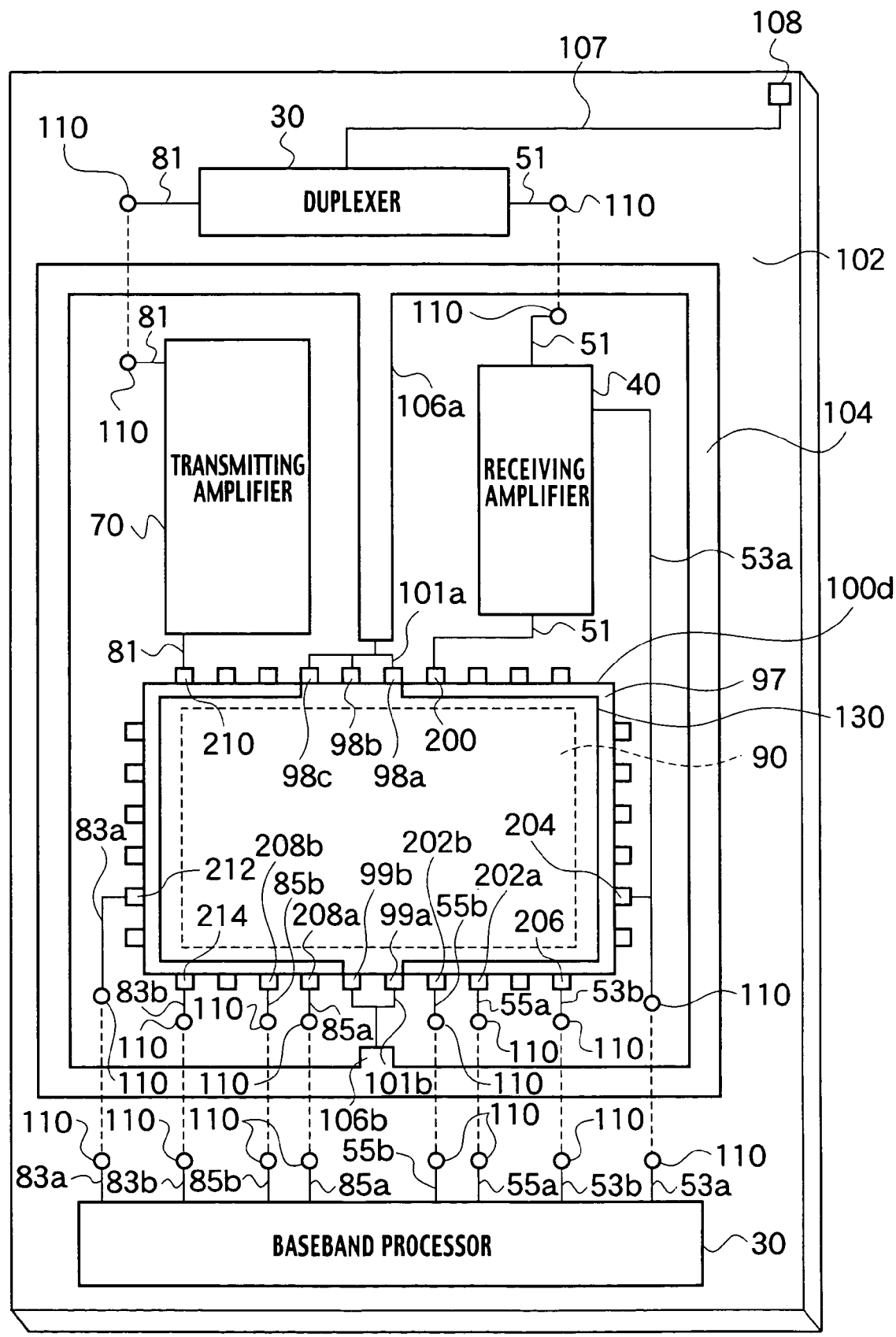
FIG. 18 is a diagram showing an example of an assembly of a wireless communication apparatus according to a third modification of the embodiment of the present invention.
Figure 19:
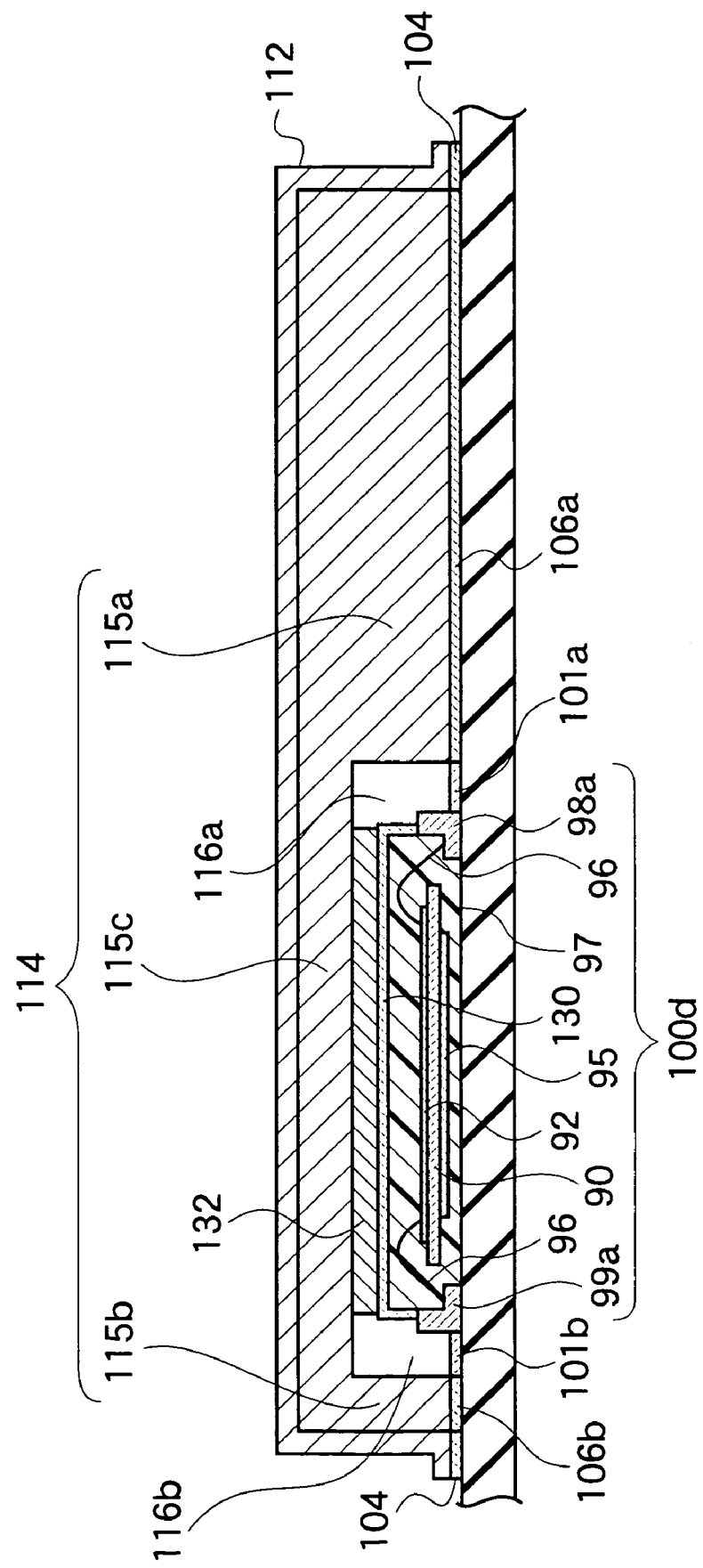
FIG. 19 is a diagram showing an example of a cross section of a mounted shield partition of the wireless communication apparatus according to the third modification of the embodiment of the present invention.

As shown in FIG. 18, in a processor unit 100d used for a wireless communication apparatus according to a third modification of the embodiment of the present invention, an external ground electrode 130 connected to the first ground terminals 98a to 98c and the second ground terminals 99a and 99b is provided on a surface of the package 97. In the embodiment, interference waves from external wireless communication apparatuses and electromagnetic disturbance waves of spurious signals and the like emitted from the transmitting amplifier 70 can be shielded by the shield case 112 and the shield partition 114 shown in FIG. 5. However, as shown in FIG. 6, a part of the spurious signals emitted from the transmitting amplifier 70 leak to the receiving amplifier 40 through the gap 116 between the processor unit 100 and each of the first partitions 115a, the second partitions 115b, and the cut 115c of the shield partition 114, thus causing interference. FIG. 19 corresponds to the IV-IV cross-sectional view of FIG. 5 taken along the longitudinal direction of the shield partition 114. The third modification of the embodiment is different from the embodiment in that a conductive member 132, such as a conductive, elastic sponge is buried between the external ground electrode 130 and the cut 115c to provide shielding between the cut 115c and the processor unit 100d, as shown in FIG. 19. Other configurations are similar to those of the embodiment. Therefore redundant descriptions will be omitted.

As shown in FIG. 19, in the third modification of the embodiment, the shield partition 114 is connected to the external ground electrode 130 provided on the processor unit 100d using the conductive member 132. The conductive member 132 is connected to the ground plane of the wireless communication apparatus through the shield partition 114 and the first and second ground terminals 98a to 98c and 99a and 99b of the processor unit 100d. As a result, the conductive member 132 can shield spurious signals and the like emitted from the transmitting amplifier 70. Thus, leakage paths of spurious signals and the like from the transmitting amplifier 70 to the receiving amplifier 40 are only the gaps 116a and 116b remaining between the processor unit 100d and each of the first and second partitions 115a and 115b of the shield partition 114. Therefore, it is possible to suppress the interference caused by the leakage of spurious signals emitted from the transmitting amplifier 70, to the receiving amplifier 40.

Further, the external ground electrode 130 of the processor unit 100d is connected to each of the first and second ground terminals 98a to 98c and 99a and 99b. However, of course, the external ground electrode 130 may be connected to any one of the first and second ground terminals 98a to 98c and 99a and 99b. Moreover, since the conductive member 132 is connected to the ground plane of the wireless communication apparatus through the shield partition 114, the external ground electrode 130 does not need to be connected to any of the first and second ground terminals 98a to 98c and 99a and 99b.

In the third modification of the embodiment, since the processor unit 100d of a transceiver monolithic IC is used, the wireless communication apparatus can be miniaturized. Moreover, interference waves from external wireless communication apparatuses to the receiving amplifier 40 in the receiving unit 32, the transmitting amplifier 70 in the transmitting unit 34, and the processor unit 10d, can be shielded by the shield case 112. Further, the first partition 105a of the shield partition 114 makes it possible to suppress the direct interference from spurious signals and the like emitted from the transmitting amplifier 70, to the receiving amplifier 40. Furthermore, since the conductive member 132 is buried between the cut 115c of the shield partition 114 and the external ground electrode 130 provided on the surface of the processor unit 100d, it is possible to suppress the interference caused by the leakage of spurious signals emitted from the transmitting amplifier 70, to the receiving amplifier 40. Thus, in the wireless communication apparatus according to the third modification of the embodiment, miniaturization can be achieved using the processor unit 100d of a transceiver monolithic IC, and deterioration of receiving characteristics of the receiving unit 32 can be reduced by suppressing electromagnetic disturbance waves and leakage signals entering the receiving unit 32 from the transmitting unit 34.

Other Embodiments

Although the embodiment of the present invention has been described as above, it will be understood that the present invention is not limited to statements and drawings constituting part of the present disclosure. Various alternate embodiments, examples, and operational techniques will become apparent to those skilled in the art from the present disclosure.

The embodiment of the present invention has been described using a QFP of a surface mount type as the package 97 for the processor units 100 and 100a to 100e. However, the package 97 is not limited to a QFP. For example, a small outline package (SOP) or the like of a surface mount type may be possible, or a dual inline package (DIP) or the like of a pin insertion type may also be possible. Moreover, in the above-described packages, terminals are provided on sides of the packages. However, a ball grid array (BGA) of a surface mount type, a pin grid array (PGA) of a pin insertion type, and the like, in which terminals are provided on a rear surface of a package, may be possible.

Figure 20:
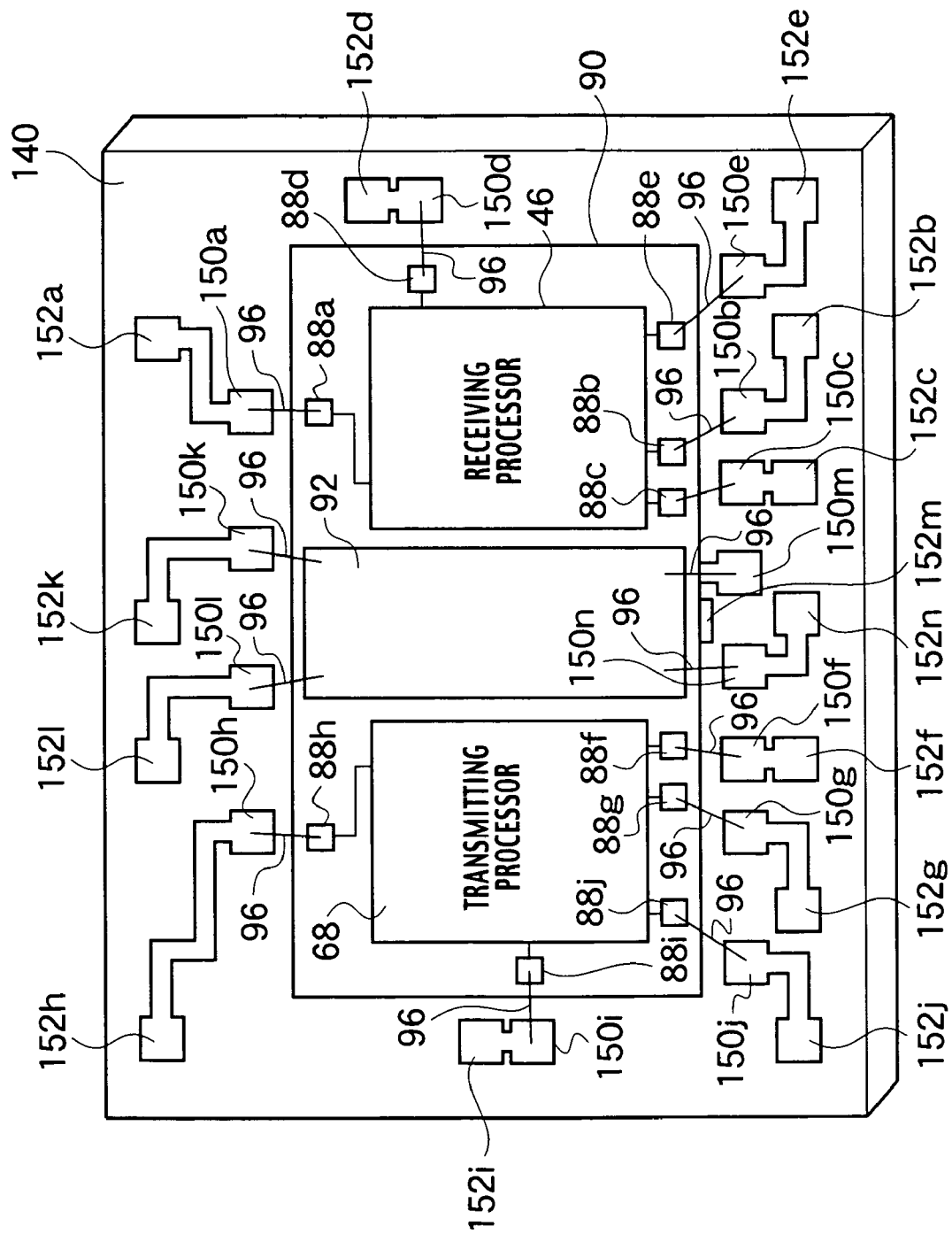
FIG. 20 is a diagram showing an example of a semiconductor device according to other embodiment of the present invention.

For example, as shown in FIG. 20, in a BGA-type semiconductor device, the semiconductor chip 90 is mounted on a surface of a package substrate 140. Respective bonding pads 88a to 88e are provided for the RF receiving signal input, the baseband receiving signal output, a gain control signal, and an LO control signal of the receiving processor 46 of the semiconductor chip 90. Moreover, respective bonding pads 88f to 88j are provided for the baseband transmitting signal input, the RF transmitting signal output, a gain control signal, and an LO control signal of the transmitting processor 68. On the package substrate 140, bonding pads 150a to 150j are provided respectively in the vicinities of the bonding pads 88a to 88j of the semiconductor chip 90, and respectively connected thereto using bonding wires 96. Furthermore, in the vicinity of the upper end of the semiconductor chip 90 where the bonding pads 88a and 88h are placed, the ground region 92 of the semiconductor chip 90 is connected to bonding pads 150k and 150l provided on the package substrate 140 using bonding wires 96. Similarly, in the vicinity of the lower end of the semiconductor chip 90, the ground region 92 is connected to bonding pads 150m and 150n provided on the package substrate 140 using bonding wires 96.

Figure 21:
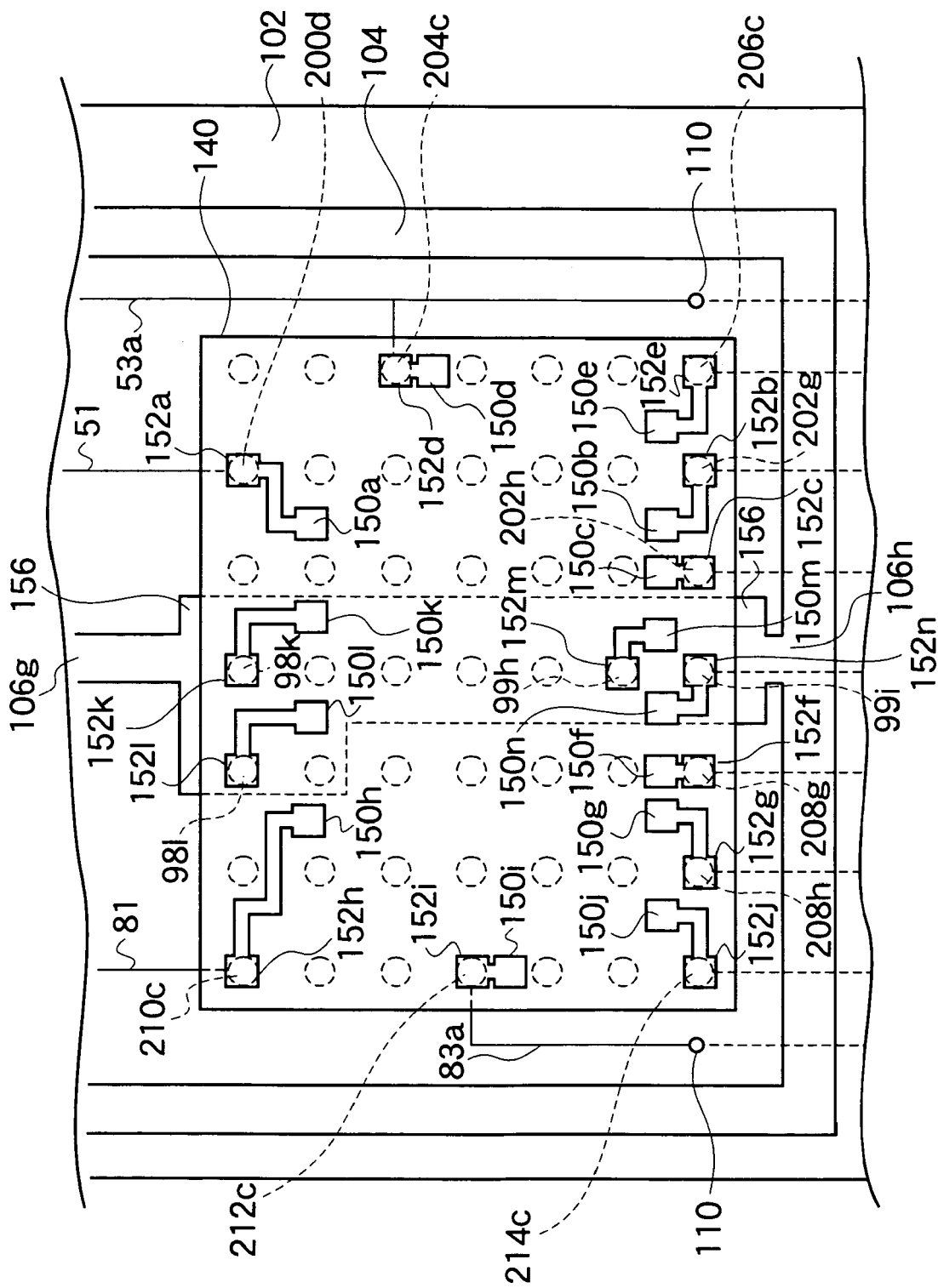
FIG. 21 is a diagram showing an example of mounting of the semiconductor device according to the other embodiment of the present invention.

The respective bonding pads 150a to 150n of the package substrate 140 are connected to wiring lands 152a to 152n. For the wiring lands 152a to 152n, through holes (not shown) are provided. The wiring lands 152a to 152n are connected to respective terminals of solder balls provided in the form of a grid on the rear surface of the package substrate 140. FIG. 21 shows an example in which the package substrate 140 is mounted on the mounting substrate 102. For ease of explanation, the semiconductor chip 90 and the package are not shown in FIG. 21. Partitioning shield ground sections 106g and 106h provided on the mounting substrate 102 so as to face each other across the package substrate 140 are connected using a ground line 156.

The wiring lands 152a to 152e of the receiving processor 46 are connected to a receiving input terminal 200d, receiving output terminals 202g and 202h, a receiving gain control terminal 204c, and a receiving LO control terminal 206c, respectively. The wiring lands 152f to 152j of the transmitting processor 68 are connected to transmitting input terminals 208g and 208h, a transmitting output terminal 210c, a transmitting gain control terminal 212c, and a transmitting LO control terminal 214c, respectively. Moreover, the wiring lands 152k and 152l connected to the ground region 92 of the semiconductor chip 90 are connected to first ground terminals 98k and 98l provided in the vicinity of the partitioning shield ground section 106g. The wiring lands 152m and 152n connected to the ground region 92 are connected to second ground terminals 99h and 99i provided close to the partitioning shield 106h. The ground region 92 of the semiconductor chip 90 is connected to the ground line 156 through the first and second ground terminals 98k, 98l, 99h, and 99i. Thus, since the ground region 92 provides the isolation between the receiving processor 46 and the transmitting processor 68, it is possible to prevent electrical deterioration of the receiving processor 46 by a leakage signal from an RF transmitting signal or a baseband transmitting signal in the transmitting processor 68.

What is claimed is:

1. A wireless communication apparatus, comprising:
   a mounting substrate including:
   a duplexer connected to an antenna terminal;
   a receiving amplifier and a transmitting amplifier individually connected to the duplexer;
   a processor unit having a receiving processor and a transmitting processor respectively connected to the receiving and transmitting amplifiers in a region spaced from the receiving and transmitting amplifiers, wherein the processor unit monolithically integrates the receiving and transmitting processors and a ground region placed between the receiving and transmitting processors on a semiconductor chip; and
   a baseband processor connected to the processor unit;
   a shield case configured to cover the receiving amplifier, the transmitting amplifier, and the processor unit; and
   a shield partition of a conductor provided in contact with the shield case, including,
   a first partition provided from a top panel of the shield case to a surface of the mounting substrate so as to separate the receiving and transmitting amplifiers by extending from an end of the shield case, and
   a second partition provided from the top panel to the surface of the mounting substrate by extending from another end of the shield case so as to face the first partition across the processing unit; and
   a cut provided from the top panel in the shield case so as to overlay the processor unit between the first and second partitions,
   wherein the ground region is electrically connected to the first and second partitions.

2. The apparatus of claim 1, wherein the first partition is connected to a first ground terminal of the processor unit, the first ground terminal being connected to an end of the ground region and being provided in a vicinity of the first partition.

3. The apparatus of claim 2, wherein the second partition is connected to a second ground terminal of the processor unit, the second ground terminal being connected to other end of the ground region and being provided in a vicinity of the second partition.

4. The apparatus of claim 3, wherein at least a part of the respective first and second ground terminals are placed to face each other.

5. The apparatus of claim 3, wherein a conductive member is placed between the cut and a package of the processor unit in contact with the cut and the package.

6. The apparatus of claim 5, wherein an external ground electrode connected to at least one of the first and second ground terminals is provided on a surface of the package, the surface being in contact with the conductive member.

7. The apparatus of claim 1, wherein the shield case is connected to ground terminals of the processor unit, the ground terminals being connected to a receiving side ground region and a transmitting side ground region, respectively, of the receiving and transmitting processors provided on opposite ends of the semiconductor chip.

* * * * *